(12) United States Patent
Lee et al.

(10) Patent No.: US 10,797,167 B2
(45) Date of Patent: *Oct. 6, 2020

(54) SUPERJUNCTION SEMICONDUCTOR DEVICE AND METHOD OF MANUFACTURING THE SAME

(71) Applicant: SEMICONDUCTOR COMPONENTS INDUSTRIES, LLC, Phoenix, AZ (US)

(72) Inventors: Kwang-won Lee, Incheon (KR); Hye-min Kang, Goyang-si (KR); Jae-gil Lee, Incheon (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/269,045

(22) Filed: Feb. 6, 2019

(65) Prior Publication Data

US 2019/0172934 A1 Jun. 6, 2019

Related U.S. Application Data

(60) Division of application No. 15/857,771, filed on Dec. 29, 2017, now Pat. No. 10,205,009, which is a (Continued)

(30) Foreign Application Priority Data

Aug. 20, 2015 (KR) ........................ 10-2015-0117345

(51) Int. Cl.
*H01L 29/36* (2006.01)
*H01L 29/10* (2006.01)
(Continued)

(52) U.S. Cl.
CPC ...... *H01L 29/7395* (2013.01); *H01L 21/2253* (2013.01); *H01L 29/0634* (2013.01);
(Continued)

(58) Field of Classification Search
CPC ............. H01L 21/2253; H01L 29/0634; H01L 29/66333; H01L 29/7395–29/7398
See application file for complete search history.

(56) References Cited

U.S. PATENT DOCUMENTS 8,084,815 B2 12/2011 Lee et al.
10,205,009 B2 * 2/2019 Lee ..................... H01L 21/2253
2009/0236697 A1 9/2009 Ono

FOREIGN PATENT DOCUMENTS

WO 2005065385 A2 7/2005

* cited by examiner

*Primary Examiner* — Daniel P Shook
(74) *Attorney, Agent, or Firm* — Brake Hughes Bellermann LLP

(57) ABSTRACT

In at least one general aspect, a method can include forming a plurality of first active pillars and a plurality of edge pillars in a first semiconductor layer including an active region and a termination region, and forming a second semiconductor layer on the first semiconductor layer. The method can include forming a plurality of second active pillars and a plurality of preliminary charge balance layers in the second semiconductor layer, and annealing the first and second semiconductor layers such that the plurality of first active pillars and the plurality of second active pillars are connected by diffusing impurities implanted into the plurality of first active pillars and the plurality of second active pillars.

22 Claims, 34 Drawing Sheets

Related U.S. Application Data continuation of application No. 15/242,018, filed on Aug. 19, 2016, now Pat. No. 9,887,280.

(51) Int. Cl.
*H01L 21/225* (2006.01)
*H01L 21/266* (2006.01)
*H01L 29/739* (2006.01)
*H01L 29/78* (2006.01)
*H01L 29/66* (2006.01)
*H01L 29/06* (2006.01)
*H01L 29/40* (2006.01)

(52) U.S. Cl.
CPC .......... *H01L 29/1095* (2013.01); *H01L 29/36* (2013.01); *H01L 29/404* (2013.01); *H01L 29/66333* (2013.01); *H01L 29/66712* (2013.01); *H01L 29/7811* (2013.01); *H01L 21/266* (2013.01)

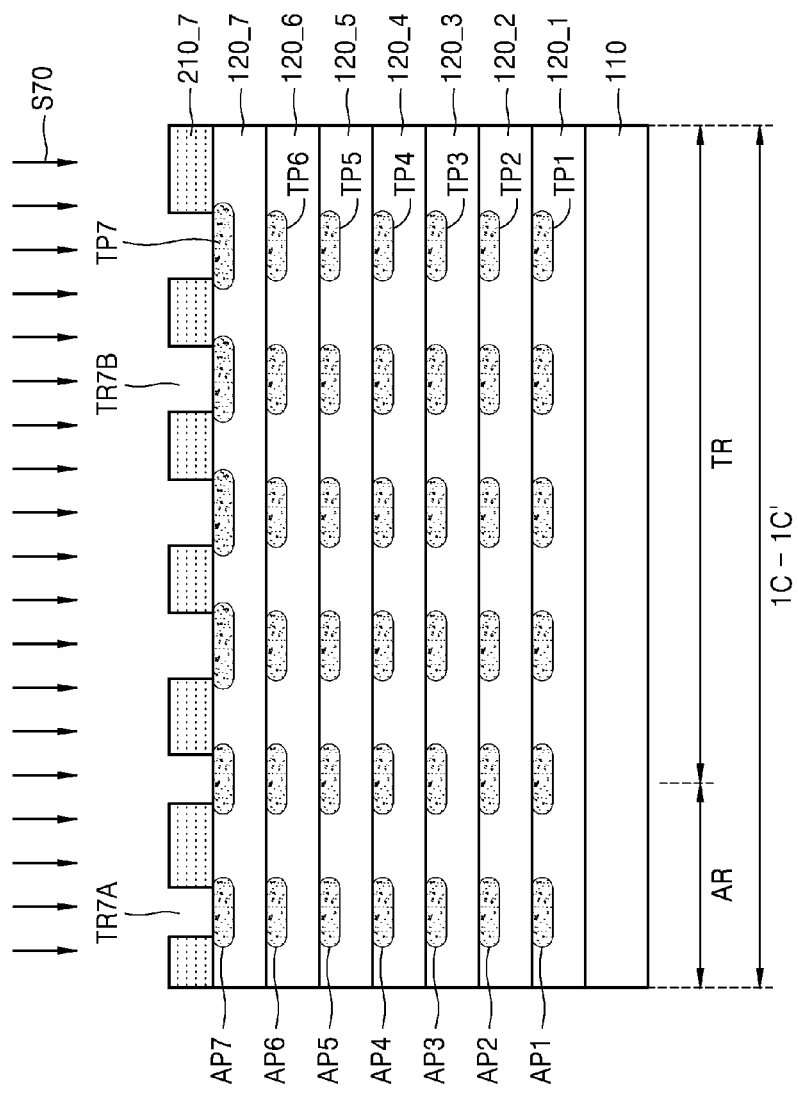

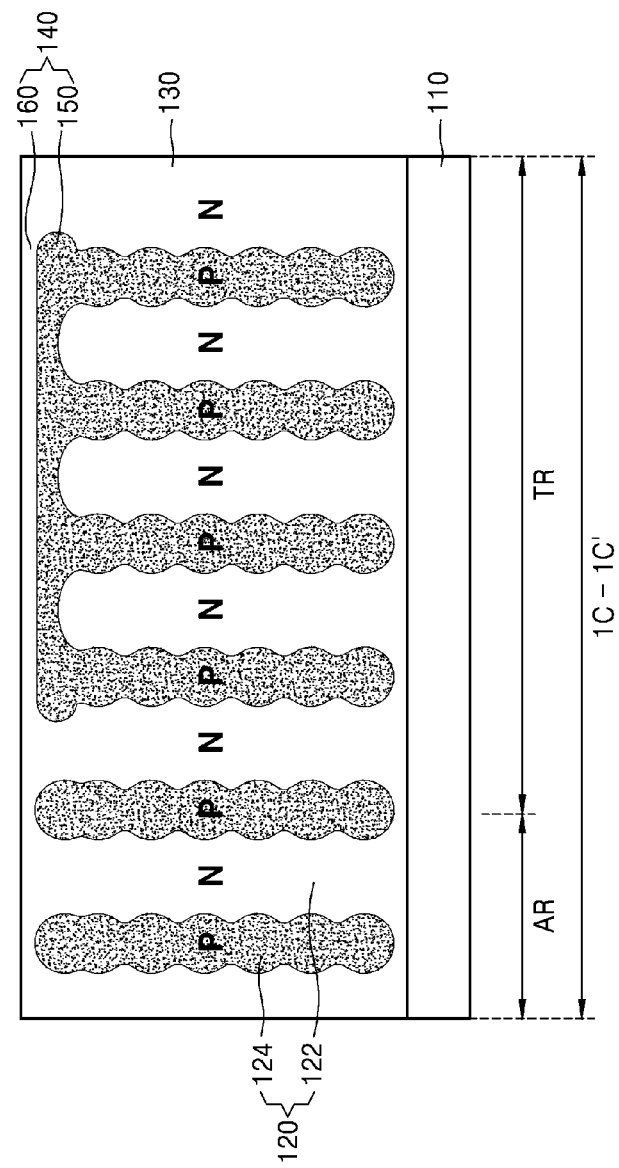

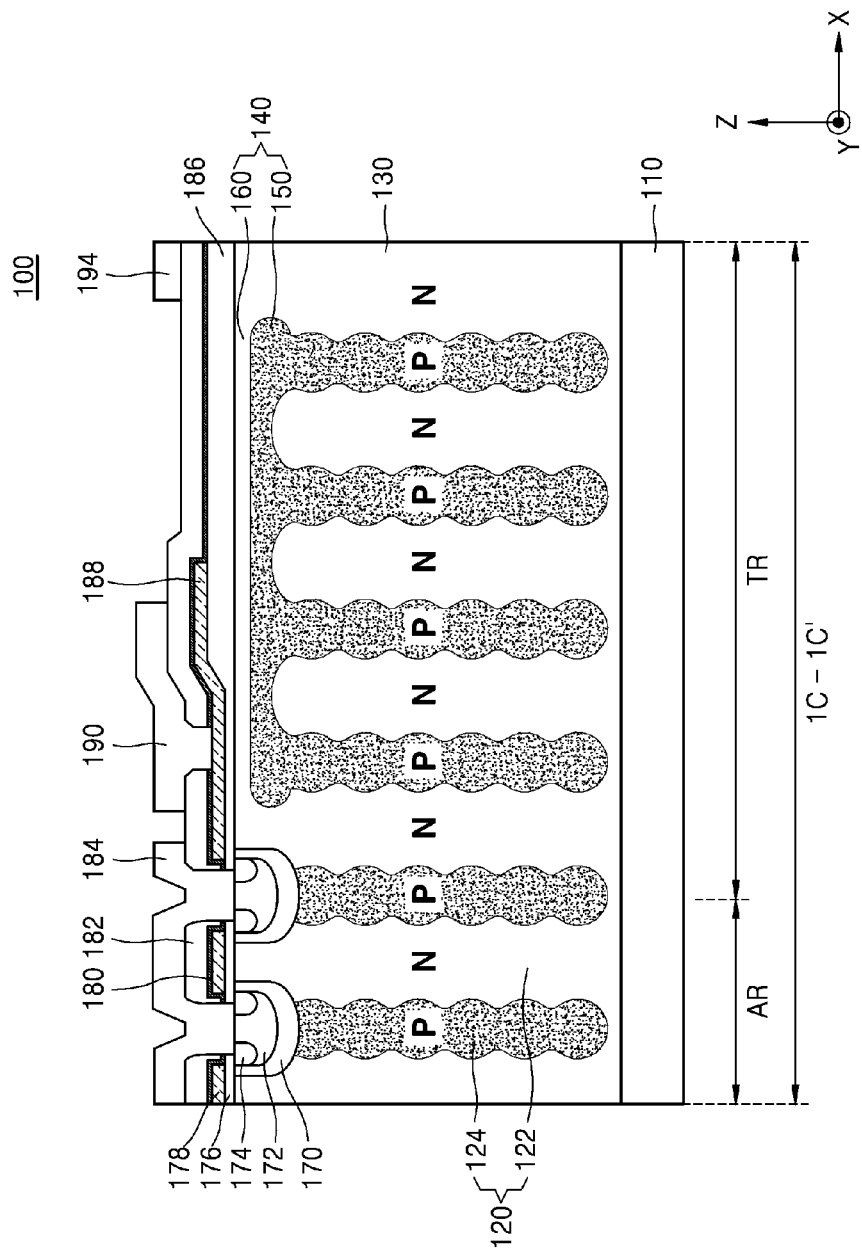

US 10,797,167 B2

SUPERJUNCTION SEMICONDUCTOR DEVICE AND METHOD OF MANUFACTURING THE SAME

RELATED APPLICATIONS

This Application is a Divisional of U.S. application Ser. No. 15/857,771, filed Dec. 29, 2017, which is a Continuation of U.S. application Ser. No. 15/242,018 (Now U.S. Pat. No. 9,887,280), filed Aug. 19, 2016, which claims priority to and the benefit of Korean Application No. 10-2015-0117345, filed Aug. 20, 2015, all of which are hereby incorporated by reference herein in their entireties.

TECHNICAL FIELD

The present disclosure relates to a superjunction semiconductor device and a method of manufacturing the same, and more particularly, to a superjunction semiconductor device including an alternating conductivity type drift layer and a method of manufacturing the same.

BACKGROUND

Power MOSFET devices or insulated gate bipolar transistor (IGBT) devices may be used as switching devices in electronic devices. Such switching devices require a low on-resistance in an operating state, a high breakdown voltage, and a high switching speed. Since the on-resistance and the breakdown voltage generally have a trade-off relationship, it is difficult to implement a switching device simultaneously satisfying a low on-resistance and a high breakdown voltage. Recently, it has been reported that, among power MOSFET devices, a MOSFET device having a superjunction structure including an alternating conductivity type drift layer can simultaneously realize a low on-resistance and a high breakdown voltage. However, as dopant concentrations of P-type and N-type regions in the alternating conductivity type drift layer are decreased (or as breakdown voltages are increased), a field oxide is damaged by a high voltage applied to a termination region surrounding the P-type and N-type regions, and therefore, the reliability of the MOSFET device may be degraded.

SUMMARY

According to an aspect of the present disclosure, there is provided a superjunction semiconductor device including: a first semiconductor layer doped with a first conductivity type; an active region formed on the first semiconductor layer, the active region including a drift layer; and a termination region disposed to surround the active region, the termination region including a lower edge region disposed on a side surface of the drift layer and an upper edge region disposed on the lower edge region, wherein the upper edge region includes a lower charge balance region disposed on the lower edge region, the lower charge balance region having a second conductivity type different from the first conductivity type, and an upper charge balance region disposed on the lower charge balance region, the upper charge balance region having the first conductivity type.

In exemplary embodiments, the upper charge balance region may be disposed on substantially the entire area of the termination region.

In exemplary embodiments, the drift layer may include a first portion having the first conductivity type and a second portion having the second conductivity type, which extend along a first direction parallel to a top surface of the first semiconductor layer and are alternately arranged.

In exemplary embodiments, the lower edge region may include: first and second edge pillars respectively connected to the first and second portions of the drift layer; and third and fourth edge pillars extending in the first direction on one side of the drift layer, the third and fourth edge pillars not being respectively connected to the first and second portions of the drift layer. The first and third edge pillars may have the first conductivity type and the second and fourth edge pillars may have the second conductivity type.

In exemplary embodiments, the lower charge balance region may be disposed on the first to fourth edge pillars.

In exemplary embodiments, the upper charge balance region may vertically overlap with the first to fourth edge pillars.

In exemplary embodiments, uppermost sidewalls of the first and second portions of the drift layer may be in contact with a sidewall of the upper charge balance region.

In exemplary embodiments, an interface between the upper and lower charge balance regions may be disposed to be spaced apart from a top surface of the upper charge balance region in a third direction perpendicular to the top surface of the first semiconductor layer.

In exemplary embodiments, the lower charge balance region may have a first impurity concentration, the second portion of the drift layer may have a second impurity concentration, and the first impurity concentration may be smaller than the second impurity concentration.

In exemplary embodiments, the lower and upper charge balance regions may form a P-N junction.

In exemplary embodiments, the drift layer may have a first height along a third direction perpendicular to the top surface of the first semiconductor layer, the lower edge region may have a second height along the third direction, and the second height may be about 70% to 98% of the first height.

In exemplary embodiments, the drift layer may have a first height along a third direction perpendicular to the top surface of the first semiconductor layer, the lower edge region may have a second height along the third direction, and the second height may be about 85% to 95% of the first height.

According to an aspect of the present disclosure, there is provided a superjunction semiconductor device including an active region and a termination region surrounding the active region, wherein the active region includes: a first semiconductor layer having N-type conductivity; and a drift layer disposed on the first semiconductor layer, wherein the termination region includes an upper edge region provided with a lower charge balance region disposed on one side of the drift layer, the lower charge balance region having P-type conductivity; and an upper charge balance region disposed on the lower charge balance region, the upper charge balance region having N-type conductivity.

In exemplary embodiments, the upper charge balance region may be formed on substantially the entire area of the termination region, and the lower charge balance region may vertically overlap with the upper charge balance region.

In exemplary embodiments, the drift layer may include a plurality of N-type pillars and a plurality of P-type pillars, which extend along a first direction parallel to a top surface of the first semiconductor layer and are alternately arranged.

In exemplary embodiments, the superjunction semiconductor device may further include a lower edge region disposed under the upper charge balance region, on a side surface of the drift layer. The lower edge region may include a plurality of first N-type edge pillars and a plurality of first P-type edge pillars, which are respectively connected to the plurality of N-type pillars and the plurality of P-type pillars.

In exemplary embodiments, the lower edge region may include a plurality of second N-type edge pillars and a plurality of second P-type edge pillars, which are disposed on one side of the plurality of first N-type edge pillars and the plurality of first P-type edge pillars along a second direction perpendicular to the first direction.

In exemplary embodiments, the lower charge balance region may be disposed on the plurality of first N-type edge pillars, the plurality of second N-type edge pillars, the plurality of first P-type edge pillars, and the plurality of second P-type edge pillars.

In exemplary embodiments, the lower charge balance region may include a first region and a second region, which are located on the plurality of first P-type edge pillars, and the first region may be located closer to the drift layer than the second region. A third impurity concentration of the first region may be substantially equal to a fourth impurity concentration of the second region.

In exemplary embodiments, the lower charge balance region may include a third region and a fourth region, which are respectively located on two of the plurality of second P-type edge pillars, and the third region may be located closer to the drift layer than the fourth region. A fifth impurity concentration of the third region may be substantially equal to a sixth impurity concentration of the fourth region.

In exemplary embodiments, the lower charge balance region may include a first region and a second region, which are located on the plurality of first P-type edge pillars, and the first region may be located closer to the drift layer than the second region. A third impurity concentration of the first region may be greater than a fourth impurity concentration of the second region.

In exemplary embodiments, the lower charge balance region may include a third region and a fourth region, which are respectively located on two of the plurality of second P-type edge pillars, and the third region may be located closer to the drift layer than the fourth region. A fifth impurity concentration of the third region may be greater than a sixth impurity concentration of the fourth region.

In exemplary embodiments, the lower charge balance region may include a fifth region and a sixth region, and the fifth region may be located closer to the drift layer than the sixth region. The fifth region may have a first thickness along a third direction perpendicular to the top surface of the first semiconductor layer, and the sixth region may have a second thickness smaller than the first thickness along the third direction.

According to an aspect of the present disclosure, there is provided a method of manufacturing a superjunction semiconductor device, the method including: forming a plurality of first active pillars and a plurality of first edge pillars in a first semiconductor layer including an active region and a termination region; forming a second semiconductor layer on the first semiconductor layer; forming a plurality of second active pillars and a plurality of preliminary charge balance layers in the second semiconductor layer; and annealing the first and second semiconductor layers such that the plurality of first active pillars and the plurality of second active pillars are connected to each other by diffusing impurities implanted into the plurality of first active pillars and the plurality of second active pillars.

In exemplary embodiments, forming the plurality of second active pillars and the plurality of preliminary charge balance layers may include respectively implanting impurities into the active region and the termination region of the second semiconductor layer, using a second ion implantation mask, thereby forming the plurality of second active pillars and the plurality of preliminary charge balance layers, and the second ion implantation mask may include a plurality of stripe-shaped first trenches extending in a first direction and a plurality of openings spaced apart from each other in the first direction and a second direction perpendicular to the first direction.

In exemplary embodiments, forming the plurality of first active pillars and the plurality of first edge pillars may include respectively implanting impurities in the active region and the termination region of the first semiconductor layer, using a first ion implantation mask, thereby forming the plurality of first active pillars and the plurality of first edge pillars, and the first ion implantation mask may include a plurality of stripe-shaped second trenches extending in a first direction and a plurality of stripe-shaped third trenches extending in the first direction.

In exemplary embodiments, in the annealing, impurities implanted into the plurality of first edge pillars and the plurality of preliminary charge balance layers may be diffused, and the plurality of first edge pillars and the plurality of preliminary charge balance layers may be connected to each other.

In exemplary embodiments, in the annealing, impurities implanted into the plurality of preliminary charge balance layers may be diffused, and adjacent ones of the plurality of preliminary charge balance layers may be connected to each other, thereby forming a lower charge balance region.

According to the embodiments, the superjunction semiconductor device includes a lower charge balance region in an upper edge region of a termination region, and an upper charge balance region on the lower charge balance region. The lower charge balance region has a P-type conductivity and the upper charge balance region has an N-type conductivity. The lower and upper charge balance regions may form a P-N junction which is disposed along a vertical direction, and an interface of the P-N junction may be formed to be spaced apart by a predetermined depth from an upper surface of the termination region. Thus, in an off state of the superjunction semiconductor device, it is possible to prevent the phenomenon that a stress caused by electric fields, which is induced by a high breakdown voltage, is concentrated in the vicinity of the upper surface of the termination region. Accordingly, a field oxide layer formed on the upper surface of the termination region may not be easily damaged by the high electric fields, and the superjunction semiconductor device may have excellent reliability.

BRIEF DESCRIPTION OF THE DRAWINGS

FIGS. 8A, 8B, 9, 10, 11, 12, 13, 14A, 14B, 15, 16, 17, and 18 are views illustrating a method of manufacturing a superjunction semiconductor device according to exemplary embodiments.

DETAILED DESCRIPTION

Figure 1A:
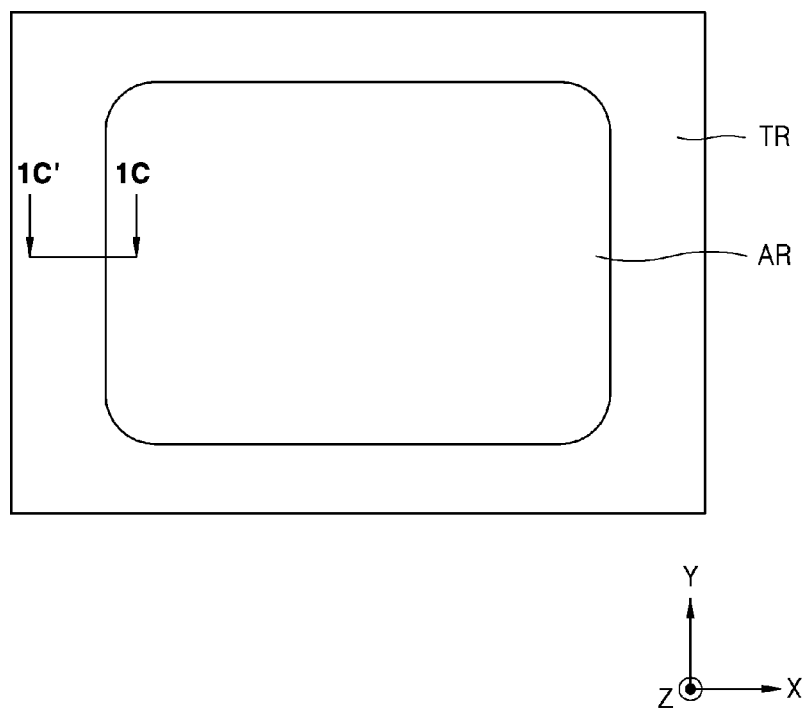
FIG. 1A is a top view illustrating a schematic configuration of a superjunction semiconductor device according to exemplary embodiments.

Certain exemplary embodiments of the present disclosure will now be described in greater detail with reference to the accompanying drawings to assist in a comprehensive understanding of constitution and effects of the present disclosure. However, the present disclosure is not limited to the embodiments disclosed herein, but can be implemented in a variety of configurations with a variety of modifications. Accordingly, it is apparent that the exemplary embodiments of the present disclosure are provided to perfect the present disclosure, and to inform those skilled in the art of the scope of the present disclosure completely. For convenience of explanation, in the accompanying drawings, certain elements may be enlarged from actual size, and the respective elements may be illustrated on an exaggerated or reduced scale.

When an element is stated as being "on" or "in contact with" another element, it may be understood that the element may be contacted with, or connected to another element directly, or contacted or connected via yet another element which may be present in between. On the contrary, when a certain element is stated as being "directly on" or "in direct contact with" another element, it may be understood that presence of any intervening element therebetween is foreclosed. Other expressions such as "between" and "directly between" that explain a relationship between elements may be interpreted likewise.

The expression of "first," "second" or the like may be used to explain a variety of elements, but should not be construed as limiting the elements. The above expressions may be used exclusively for the purpose of distinguishing one element from another. For example, without departing from the scope of the present disclosure, the first element may be referred to as the second element, or likewise, the second element may be referred to as the first element.

Unless otherwise explicitly stated, a singular expression encompasses a plural expression. The wording such as "comprise" or "have" used herein is intended to designate presence of characteristic, number, step, operation, element, component or a combination thereof, and may be interpreted as being open to addition of one or more other characteristics, numbers, steps, operations, elements, components or combination thereof.

Unless otherwise defined, the terms and expressions used herein may be interpreted in their meanings as generally known to those skilled in the art.

Embodiments of the present disclosure are mainly illustrated together with one example of superjunction MOSFET devices. However, the present disclosure is not limited thereto. The present disclosure may be applied to other types of power switching techniques including IGBT devices, schottky rectifiers, several types of bipolar switches, several types of thyristors, and rectifiers. Also, it is illustrated that the embodiments of the present disclosure exemplarily include n-channel MOSFETs. However, the present disclosure is not limited thereto, and may be applied to devices having the opposite conductivity type.

Hereinafter, preferred embodiments of the present disclosure will be described in detail with reference to the accompanying drawings.

Figure 1B:
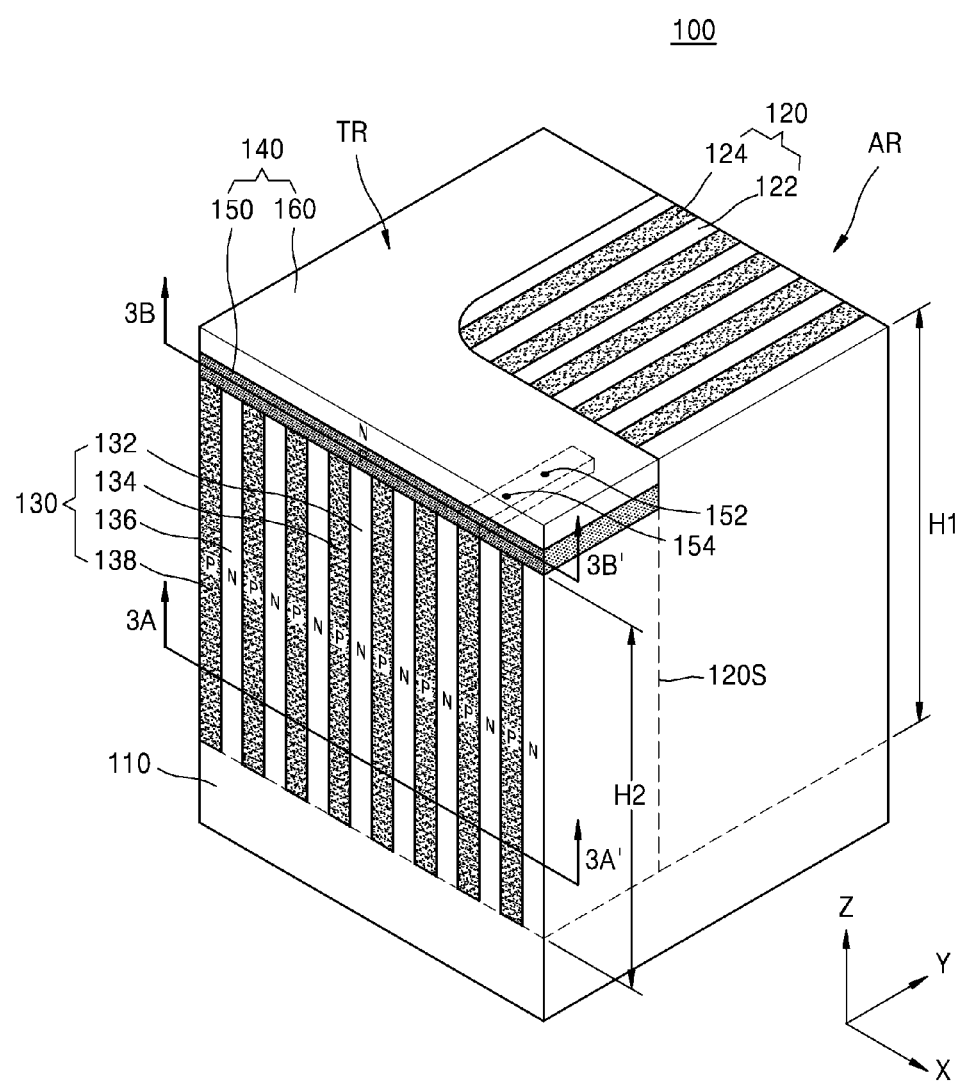
FIG. 1B is a perspective view illustrating a portion of the superjunction semiconductor device of FIG. 1A.
Figure 1C:
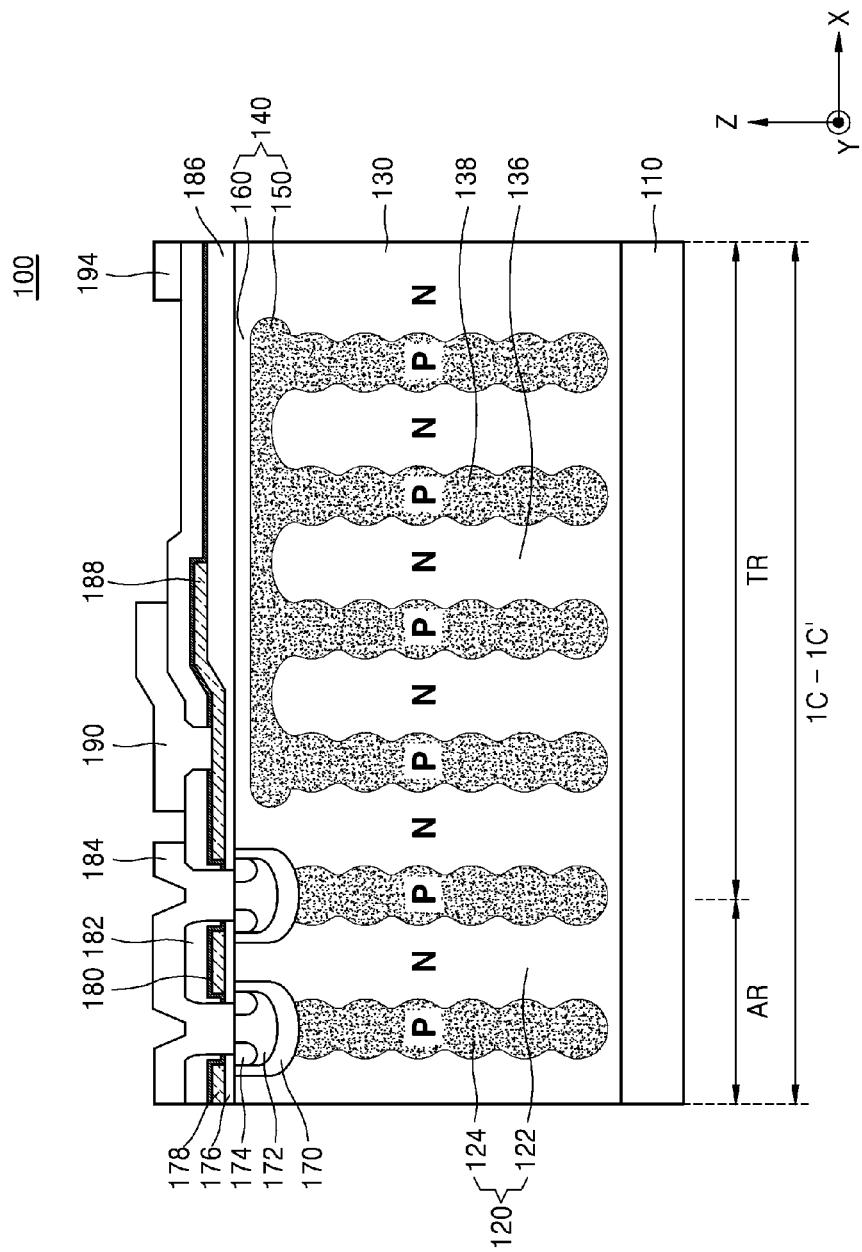
FIG. 1C is a sectional view taken along line 1C-1C' of FIG. 1A.

FIG. 1A is a top view illustrating a schematic configuration of a superjunction semiconductor device according to exemplary embodiments, FIG. 1B is a perspective view illustrating a portion of the superjunction semiconductor device 100 of FIG. 1A, and FIG. 1C is a sectional view taken along line 1C-1C' of FIG. 1A. In FIG. 1B, some components including a field plate 188, a gate electrode 190, and the like are omitted for convenience of description. These components are, however, illustrated in FIG. 1C.

Referring to FIGS. 1A to 1C, the superjunction semiconductor device 100 may include an active region AR and a termination region TR surrounding the active region AR. The termination region TR may be located on the same level as the active region AR while surrounding a sidewall of the active region AR.

The active region AR may include a first semiconductor layer 110 and a drift layer 120 disposed on the first semiconductor layer 110.

In exemplary embodiments, the first semiconductor layer 110 may be a portion of a semiconductor substrate doped with an N-type impurity at a high concentration. In some implementations, although not shown, the first semiconductor layer 110 may collectively refer to a semiconductor substrate doped with an N-type impurity at a high concentration, and an epitaxial layer formed on the semiconductor substrate where the epitaxial layer is doped with an N-type impurity at a high concentration.

In exemplary embodiments, the drift layer 120 may have a superjunction structure in which a first portion 122 including an N-type impurity and a second portion 124 including a P-type impurity are alternately disposed along a first direction (e.g., an X direction of FIG. 1B) parallel to a top surface of the first semiconductor layer 110. Here, each of the first and second portions 122 and 124 has a predetermined width in the first direction, and may have a stripe shape extending in a second direction (e.g., a Y direction of FIG. 1B) perpendicular to the first direction. In FIG. 1C, it is exemplarily illustrated that two first portions 122 and two second portions 124 are alternately disposed in the active region AR. However, the widths and numbers of the first and second portions 122 and 124 may be changed based on a function, a size, a use voltage, etc. of the superjunction semiconductor device 100.

In exemplary embodiments, the concentration of the N-type impurity of the first portion 122 may be equal to that of the P-type impurity of the second portion 124, and a first width of the first portion 122 along the X direction may be equal to a second width of the second portion 124 along the X direction. In this case, the balance between N-type and P-type charges respectively included in the first and second portions 122 and 124 inside the drift layer 120 can be maintained. In another embodiments, the concentration of the N-type impurity of the first portion 122 may be higher than that of the P-type impurity of the second portion 124, and the first width of the first portion 122 along the X direction may be smaller than the second width of the second portion 124 along the X direction. In this case, the concentrations of the N-type and P-type impurities and the first and second widths may be appropriately selected such that the balance between N-type and P-type charges respectively included in the first and second portions 122 and 124 inside the drift layer 120 can be maintained. In still another embodiments, the concentration of the N-type impurity of the first portion 122 may be lower than that of the P-type impurity of the second portion 124, and the first width of the first portion 122 along the X direction may be greater than the second width of the second portion 124 along the X direction.

In exemplary embodiments, a P body region 170 adjacent to an upper surface of the drift layer 120 may be disposed over the second portion 124 of the drift layer 120, and a P+ region 172 may be disposed inside the P body region 170. Two N+ regions 174 may be disposed in the P+ region 172. Here, the two N+ regions 174 have a predetermined depth from the upper surface of the drift layer 120, and are spaced apart from each other. A gate dielectric layer 176 may be disposed on the first portion 122 of the drift layer 120, and an active poly gate layer 178 may be disposed on the gate dielectric layer 176. A spacer 180 made of, for example, silicon nitride may be conformally disposed over the active poly gate layer 178, and an insulating layer 182 may be disposed over the spacer 180. A source electrode 184 may be disposed over the insulating layer 182. The source electrode 184 may be in contact with a top surface of the P+ region 172.

The termination region TR may be disposed to surround the drift layer 120 above the first semiconductor layer 110. The termination region TR may include a lower edge region 130 located on the substantially same level as a lower portion of the drift layer 120. The lower edge region 130 may be disposed on a side surface 120S of the drift layer 120. The termination TR may also include an upper edge region 140 surrounding the drift layer 120 and disposed on (e.g., disposed above) the lower edge region 130.

The lower edge region 130 may include N-type and P-type pillars alternately disposed along the X direction of FIG. 1B on the first semiconductor layer 110. As the lower edge region 130 has a superjunction structure in which the N-type and P-type pillars are alternately disposed, the breakdown voltage of the superjunction semiconductor device 100 may increase.

In exemplary embodiments, the lower edge region 130 may include first to fourth edge pillars 132, 134, 136, and 138. The first and second edge pillars 132 and 134 may be portions of the N-type and P-type pillars, respectively. The first and second edge pillars 132 and 134 may be respectively connected to the first and second portions 122 and 124 of the drift layer 120. The third and fourth edge pillars 136 and 138 may be respectively N-type and P-type pillars not connected to the active region AR, the N-type and P-type pillars extending in the Y direction.

In exemplary embodiments, the width of the first edge pillar 132 along the X direction may be substantially equal to the first width of the first portion 122 of the drift layer 120, and the width of the second edge pillar 134 along the X direction may be substantially equal to the second width of the second portion 124 of the drift layer 120. However, the present disclosure is not limited thereto. In addition, the widths of the third and fourth edge pillars 136 and 138 along the X direction may be respectively equal to or different from those of the first and second edge pillars 132 and 134 along the X direction. The widths of the third and fourth edge pillars 136 and 138 along the X direction may be appropriately selected based on a function, a size, a use voltage, etc. of the superjunction semiconductor device 100.

The upper edge region 140 may include a lower charge balance region 150 and an upper charge balance region 160.

In exemplary embodiments, the upper charge balance region 160 may be disposed throughout substantially the entire area of the termination region TR as exemplarily shown in FIG. 1B. For example, the upper charge balance region 160 may be disposed to vertically overlap with the first to fourth edge pillars 132, 134, 136, and 138 of the lower edge region 130. The upper charge balance region 160 may be an N-type region including an N-type impurity.

In exemplary embodiments, the lower charge balance region 150 may be disposed between the upper charge balance region 160 and the lower edge region 130. A bottom surface of the lower charge balance region 150 may be in contact with top surfaces of the first to fourth edge pillars 132, 134, 136, and 138 of the lower edge region 130. The lower charge balance region 150 may be a P-type region including a P-type impurity. The lower charge balance region 150 may have various P-type impurity concentration profiles on an X-Y plane. For example, the lower charge balance region 150 may have a constant P-type impurity concentration profiles on the X-Y plane. Alternatively, the lower charge balance region 150 may have a periodic concentration profile having a periodic increase and decrease in impurity concentration along each of the X and Y directions. The impurity concentration profile of the lower charge balance region 150 will be described in detail later with reference to FIGS. 4B and 6B.

In exemplary embodiments, an interface between the lower and upper charge balance regions 150 and 160 may be disposed throughout the substantially entire area of the termination region TR to vertically overlap with the first to fourth edge pillars 132, 134, 136, and 138. For example, the interface between the lower and upper charge balance regions 150 and 160 may be a flat surface (e.g., a substantially planar surface, a surface aligned within a plane) continuously formed on the X-Y plane. The lower and upper charge balance regions 150 and 160 may form a P-N junction structure disposed in the vertical direction. Accordingly, in an off state of the superjunction semiconductor device 100, a high electric field applied to a junction surface of the P-N junction structure (or the interface between the lower and upper charge balance regions 150 and 160) can be located to be spaced by a predetermined depth in a Z direction from a top surface of the upper charge balance region 160. Thus, an electric field applied to a surface of the upper charge balance region 160 can be decreased, and a stress caused by the high electric field is prevented from being applied to a field oxide layer 186 disposed on the upper charge balance region 160, thereby increasing the breakdown voltage of the superjunction semiconductor device 100.

As shown in FIG. 1B, the drift layer 120 may have a first height H1 along the Z direction, and the lower edge region 130 may have a second height H2 along the Z direction. The second height H2 of the lower edge region 130 may be smaller than the first height H1 of the drift layer 120. For example, bottom surfaces of the drift layer 120 and the lower edge region 130 may be located on the same vertical (Z direction) level, and a top surface of the drift layer 120 may be located on a higher vertical level than that of a top surface of the lower edge region 130. In exemplary embodiments, the second height H2 of the lower edge region 130 may be greater than or equal to 70% of the first height H1 of the drift layer 120 and may be smaller than or equal to 98% of the first height H1 of the drift layer 120. For example, the second height H2 of the lower edge region 130 may be greater than or equal to 85% of the first height H1 of the drift layer 120 and may be smaller than or equal to 95% of the first height H1 of the drift layer 120. However, the present disclosure is not limited thereto.

As the second height H2 of the lower edge region 130 decreases, the heights of the N-type and P-type pillars alternately disposed in the lower edge region 130 decreases, and accordingly, the breakdown voltage of the superjunction semiconductor device 100 may decrease. For example, according to a simulation result obtained by changing the second height H2, a breakdown voltage of 720 V was obtained when the second height H2 was about 92% of the first height H1, and a breakdown voltage of 672 V was obtained when the second height H2 was about 85% of the first height H1. That is, it may be preferred that the heights of the N-type and P-type pillars be selected as large values so as to increase the breakdown voltage of the superjunction semiconductor device 100.

On the other hand, when the second height H2 of the lower edge region 130 is excessively large (e.g., when the difference between the second height H2 of the lower edge region 130 and the first height H1 of the drift layer 120 is excessively small), the height of the upper edge region 140 may be relatively small, and accordingly, it may be difficult to stably form the P-N junction structure in the upper edge region 140 in which the lower and upper charge balance regions 150 and 160 are vertically disposed. Particularly, it is difficult to sufficiently secure a spacing distance along the Z direction between the top surface of the upper charge balance region 160 and the interface between the lower and upper charge balance regions 150 and 160, and therefore, a high electric field may be applied to the surface of the upper charge balance region 160 in an off state of the superjunction semiconductor device 100.

As exemplarily shown in FIG. 1B, the first and second edge pillars 132 and 134 of the lower edge region 130 are respectively connected to the first and second portions 122 and 124 of the drift layer 120 located inside the active region AR, so that both the first edge pillar 132 and the first portion 122 can constitute an N-type pillar and both the second edge pillar 134 and the second portion can constitute a P-type pillar. The N-type and P-type pillars may extend along the Y-direction of FIG. 1B. Therefore, the electric field applied to the active region AR may reach an outer wall of the termination region TR (or a sidewall portion of the termination region TR, located most distant from the active region AR) at a relatively high speed along the Y-direction, i.e., the extending directions of the N-type and P-type pillars. However, in the case of the transmission of an electric field along the X direction, as a plurality of N-type and P-type pillars are alternately disposed in the X direction and have a superjunction structure, the electric field applied to the active region AR may reach the outer wall of the termination region TR at a relatively low speed along the X direction. That is, there may occur a phenomenon that electric fields are asymmetrically transmitted along the X and Y directions in the lower edge region 130. Here, the transmission of an electric field along the extending direction (i.e., the Y direction) of the N-type and P-type pillars may be faster.

On the other hand, in the upper edge region 140, the N-type and P-type pillars may not extend in the termination region TR. The first portion 122 of the drift layer 120 located on the same level as the upper edge region 140 may be in contact with the vertically arranged lower and upper charge balance regions 150 and 160. Also, the second portion 124 of the drift layer 120 located on the same level as the upper edge region 140 may be in contact with the vertically arranged lower and upper charge balance regions 150 and 160. The lower and upper charge balance regions 150 and 160 constitute a P-N junction in the vertical direction, the impurity concentration and/or a vertical thickness variation of the lower and upper charge balance regions 150 and 160 along the X direction is substantially equal to those of the lower and upper charge balance regions 150 and 160 along the Y direction. Thus, the electric fields applied to the active region AR can be transmitted up to the outer wall of the termination region TR at the substantially same speed along the X and Y directions. Accordingly, it is possible to prevent a phenomenon that electric fields are asymmetrically transmitted along the X and Y directions in the upper edge region 140.

In general, a semiconductor device having a superjunction structure including stripe-shaped N-type and P-type pillars has a structure in which the stripe-shaped N-type and P-type pillars extend even at the uppermost portion of a termination region. For example, when considering a semiconductor device having a structure in which N-type and P-type pillars extending along the Y direction, the transmission speed of an electric field along the extending direction of the N-type and P-type pillars, i.e., the Y direction, may be much higher than that of an electric field along the X direction. This is because, while the electric field can be easily transmitted by movement of an electron or hole carrier in one direction along the extending direction (Y direction) of the N-type and P-type pillars, the electric field is gradually transmitted by depletion along the X direction as P-type and N-type regions are alternately disposed along a direction (X direction) perpendicular to the extending direction. Therefore, a portion of a termination region disposed along the extending direction (Y direction) of the N-type and P-type pillars may become a weak portion to which a high electric field is locally applied. On the other hand, a relatively low electric field may be uniformly applied to a portion of the termination region disposed along the direction (X direction) perpendicular to the extending direction. A field oxide layer, etc., disposed on the weak portion is easily damaged or broken down by a high electric field. Therefore, the overall breakdown voltage of the semiconductor device decreases, or the semiconductor device is easily damaged or broken down.

Unlike the semiconductor device, in the superjunction semiconductor device 100 according to the exemplary embodiments, the N-type and P-type pillars are not formed in the upper edge region 140 disposed adjacent to the field oxide layer 186, and thus it is possible to prevent the phenomenon that the electric field is asymmetrically transmitted by the pillars. Accordingly, a relatively low electric field can be uniformly applied throughout the entire area of the upper edge region 140.

In general, a semiconductor device having a superjunction structure including rounded quadrangular shaped P-type and N-type pillars as connection region pillars in a connection region between a termination region and an active region has a structure in which the connection region pillars are disposed to surround the active region outside an outer circumferential portion of the active region. In this case, local charge imbalance may easily occur at corner portions of the connection region pillars or portions between the connection region pillars and pillars in the active region. The portions at which the charge imbalance occurs may become weak portions that cause damage or breakdown of the semiconductor device. Therefore, it is not easy to adjust the shape, width, disposition, impurity concentration, etc. of the connection region pillars so as to ensure charge balance between the connection region pillars or charge balance at portions at which the connection region pillars and the pillars in the active region are adjacent to each other.

However, in the superjunction semiconductor device 100 according to the exemplary embodiments, the N-type and P-type pillars are not formed in the upper edge region 140, and the lower charge balance region 150 can be formed throughout substantially the entire area of the termination area TR. Particularly, in a process for forming the lower charge balance region 150, the lower charge balance region 150 can be formed throughout substantially the entire area of the termination area TR through a heat treatment process for ion-implanting P-type impurities using an ion implantation mask in which openings are regularly arranged in a matrix form and diffusing the P-type impurities. Thus, excellent charge balance can be obtained even at a portion at which the active region AR and the lower charge balance region 150 are adjacent to each other. Further, accordingly, an electric field can be stably transmitted at an interface portion between the active region AR and the termination region TR.

As shown in FIG. 1C, the field oxide layer 186 may be disposed to a predetermined thickness on the upper charge balance region 160, and the field plate 188 may be disposed on the field oxide layer 186. The gate electrode 190 may be formed on the insulating layer 182 to be spaced apart from the source electrode 184. The gate electrode 190 may be electrically connected to the field plate 188. A floating electrode 194 may be disposed on the field oxide layer 186 to be spaced apart from the gate electrode 190. The floating electrode 194 may be located at an end of the termination region TR, thereby serving as a field-stop layer for stopping electric fields.

The above-described superjunction semiconductor device 100 may include the upper charge balance region 160 formed on the entire area of the termination region TR and the lower charge balance region 150 disposed under the upper charge balance region 160. In the off state of the superjunction semiconductor device 100, an interface of the P-N junction in the termination region TR may be formed to be spaced apart by a predetermined depth from the upper surface of the upper charge balance region 160, and the electric field applied to the surface of the upper charge balance region 160 may decrease. Thus, the superjunction semiconductor device 100 can have a high breakdown voltage and excellent reliability.

Figure 2:
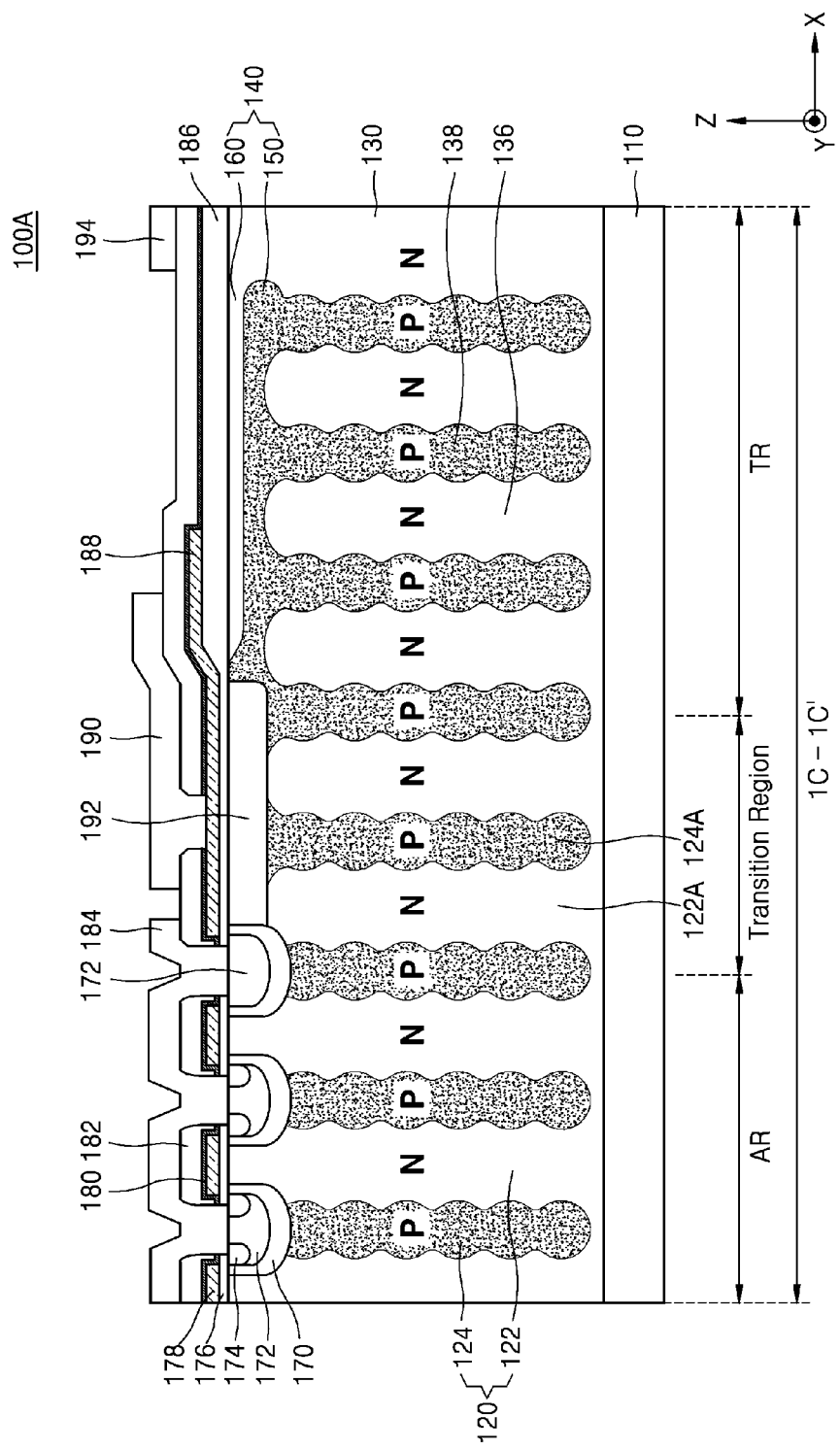
FIG. 2 is a sectional view illustrating a superjunction semiconductor device according to exemplary embodiments.

FIG. 2 is a sectional view illustrating a superjunction semiconductor device 100A according to exemplary embodiments. FIG. 2 is a sectional view corresponding to the section taken along line 1C-1C' of FIG. 1A. In FIG. 2, like reference numerals identical to those of FIGS. 1A to 1C designate the same members, and therefore, their detailed descriptions will be omitted herein.

Referring to FIG. 2, a transition region may be further formed between an active region AR and a termination region TR. The transition region may surround the active region AR, and the termination region TR may surround the transition region. P-type and N-type pillars 124A and 122A may be alternately arranged along an X direction in the transition region. A plurality of P-type pillars 124A in the transition region may be connected to each other through a diffusion region 192.

The width of the transition region may be determined by the width of the diffusion region 192. The width and impurity concentration of each of the N-type and P-type pillars 122A and 124A in the transition region may be equal to those of each of first and second portions 122 and 124 of the active region AR. In this case, charge balance between the N-type and P-type pillars 122A and 124A inside the transition region can be maintained. In another embodiments, the N-type impurity concentration of the N-type pillar 122A in the transition region may be lower than the P-type impurity concentration of the P-type pillar 124A in the transition region, and the width of the N-type pillar 122A along the X direction may be greater than that of the P-type pillar 124A along the X direction. In the case, the N-type and P-type impurity concentrations and the widths may be appropriately selected such that the charge balance between the N-type and P-type pillars 122A and 124A inside the transition region can be maintained.

Figure 3A:
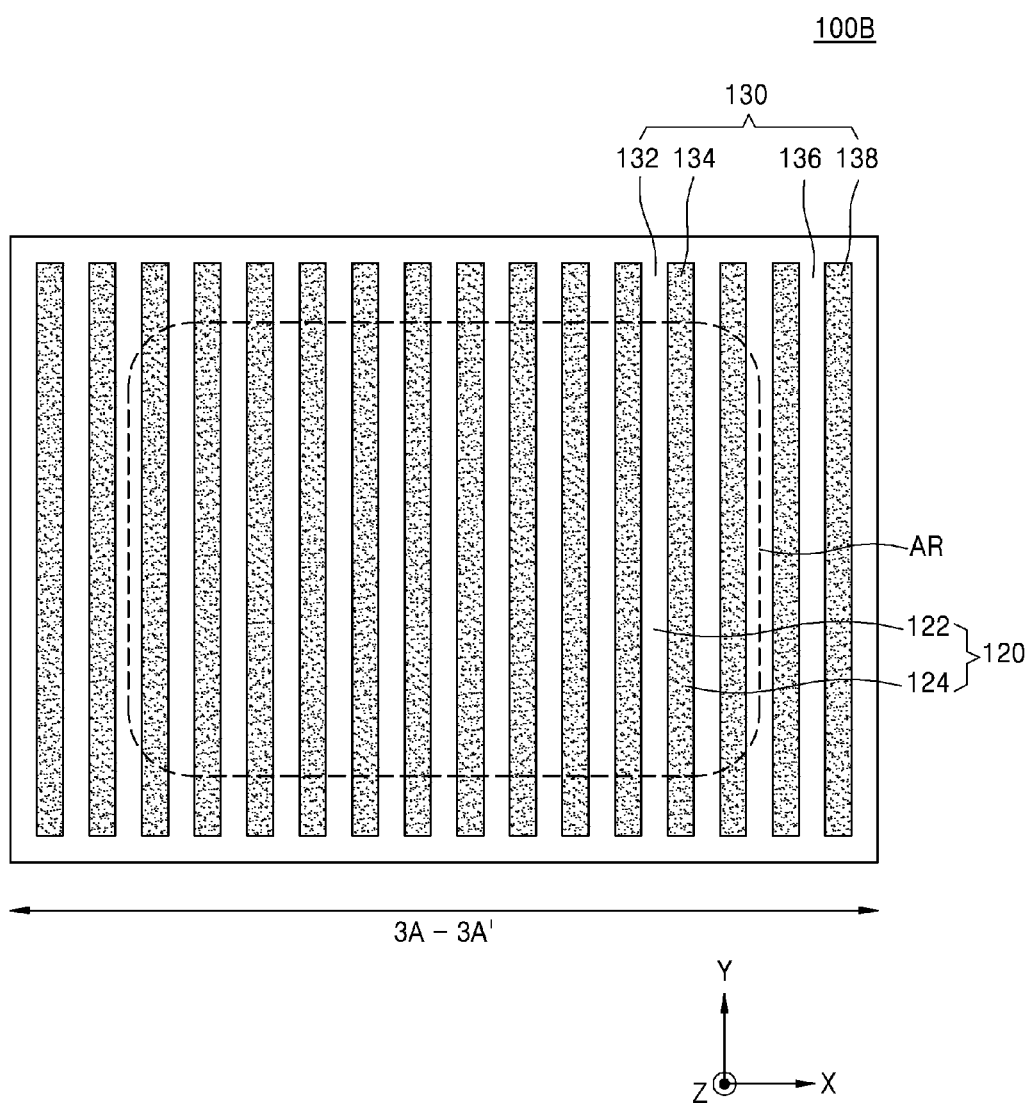
FIGS. 3A and 3B are top views illustrating a superjunction semiconductor device according to exemplary embodiments.
Figure 3B:
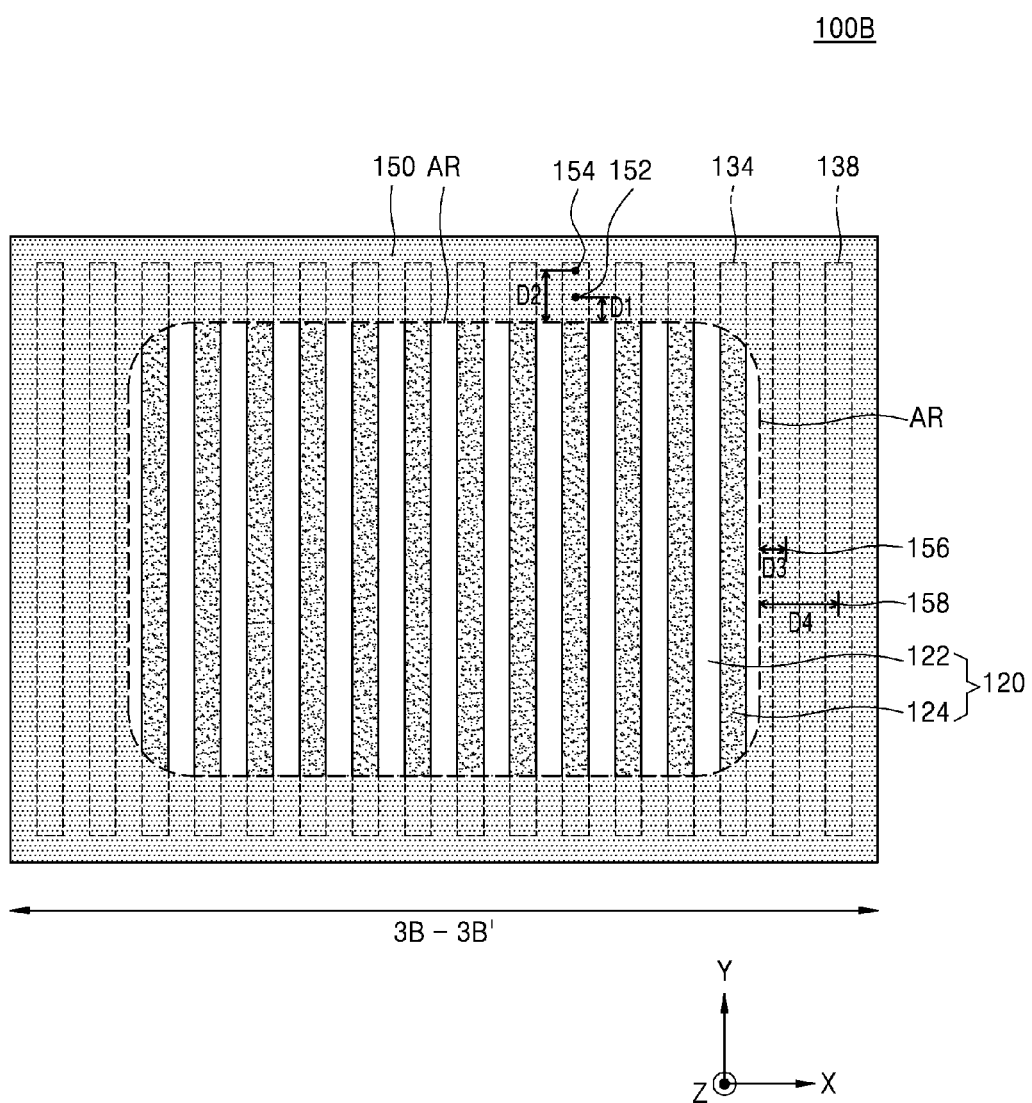

FIGS. 3A and 3B are top views illustrating a superjunction semiconductor device 100B according to exemplary embodiments. FIG. 3A is a sectional view corresponding to the section taken along line 3A-3A' of FIG. 1B, and FIG. 3B is a sectional view corresponding to the section taken along line 3B-3B' of FIG. 1B. In FIGS. 3A and 3B, like reference numerals identical to those of FIGS. 1A to 1C designate the same members, and therefore, their detailed descriptions will be omitted herein. The superjunction semiconductor device 100B according to FIGS. 3A and 3B is similar to the superjunction semiconductor device 100 described with reference to FIGS. 1A to 1C, particularly except that the P-type impurity concentration profile of a lower charge balance region 150 is different. Therefore, the above-described difference will be mainly described.

Referring to FIGS. 3A and 3B, a drift layer 120 may include first and second portions 122 and 124, and a lower edge region 130 may include first to fourth edge pillars 132, 134, 136, and 138. The first and second edge pillars 132 and 134 may be connected to the first and second portions 122 and 124, respectively. The third and fourth edge pillars 136 and 138 may extend in a Y direction outside an active region AR, and are not connected to the first and second portions 122 and 124.

The lower charge balance region 150 may be disposed to overlap with the first to fourth edge pillars 132, 134, 136, and 138 of the lower edge region 130 in a vertical direction (Z direction of FIG. 3B). The lower charge balance region 150 is located on the same level as the first and second portions 122 and 124 of the drift layer 120, and may be disposed to surround the first and second portions 122 and 124.

In exemplary embodiments, the lower charge balance region 150 may include a first region 152 and a second region 154, and the first and second regions 152 and 154 may be portions of the lower charge balance region 150 vertically overlapping with the second edge pillar 134 of the lower edge region 130. Here, a first distance D1 between the first region 152 and the active region AR may be smaller than a second distance D2 between the second region 154 and the active region AR. For example, the first region 152 may be disposed closer to a sidewall of the drift layer 120 than the second region 154.

In exemplary embodiments, the P-type impurity concentration of the first region 152 may be substantially equal to that of the second region 154. For example, a portion of the lower charge balance region 150, which vertically overlaps with the second edge pillar 134, may have a constant P-type impurity concentration along a direction distant from the drift layer 120. That is, the portion of the lower charge balance region 150, which vertically overlaps with the second edge pillar 134, may have a constant or substantially equal P-type impurity concentration profile along the Y direction of FIG. 3B.

In another embodiment, the portion of the lower charge balance region 150, which vertically overlaps with the second edge pillar 134, may have a P-type impurity concentration profile having a periodic increase/decrease along the direction distant from the drift layer 120. In this case, among sections segmented for each period in the P-type impurity concentration profile, a mean impurity concentration obtained in a first section may be substantially equal to that obtained in a second section. In exemplary embodiments, the lower charge balance region 150 may be formed by ion-implanting P-type impurities into an N-type epitaxial layer using an ion implantation mask including openings regularly arranged in a matrix form and laterally diffusing the implanted P-type impurities through a subsequent heat treatment process. In this case, the lower charge balance region 150 may have a P-type impurity concentration profile having a periodic increase/decrease.

In still another embodiment, the P-type impurity concentration of the first region 152 may be higher than that of the second region 154. For example, the portion of the lower charge balance region 150, which vertically overlaps with the second edge pillar 134, may have a P-type impurity concentration gradually decreased along the direction distant from the drift layer 120. That is, the portion of the lower charge balance region 150, which vertically overlaps with the second edge pillar 134, may have a P-type impurity concentration profile decreased along the Y direction of FIG. 3B. Therefore, the lower charge balance region 150 may include a first region 152 located close to the active region AR, the first region 152 being more P-rich, and a second region 154 located distant from the active region AR, the second region 154 being more N-rich. The first and second portions 122 and 124 of the drift layer 120 extend in the Y direction, and the first region 152 may be disposed close to the second portion 124 of the drift layer 120. As the P-rich first region 152 is disposed adjacent to the second portion 124 of the drift layer 120, a rapid difference in carrier mobility generated in the vicinity of a boundary between the active region AR and a termination region TR (e.g., a difference in P-type carrier mobility between the second portion 124 and the first region 152) can be decreased, and it is possible to prevent the phenomenon that electric fields are concentrated on the vicinity of the boundary. Thus, a relatively low electric field can be applied to the lower charge balance region 150. The effect that the electric field is decreased by the P-rich first region 152 will be described in detail later with reference to FIG. 7.

In exemplary embodiments, the lower charge balance region 150 may include a third region 156 and a fourth region 158. The third and fourth regions 156 and 158 may be respectively located on two fourth edge pillars 138 among a plurality of fourth edge pillars 138 of the lower edge region 130. Here, a third distance D3 between the third region 156 and the active region AR may be smaller than a fourth distance D4 between the fourth region 158 and the active region AR. For example, the third region 156 may be disposed closer to a sidewall of the drift layer 120 than the fourth region 158.

In exemplary embodiments, the P-type impurity concentration of the third region 156 may be substantially equal to that of the fourth region 158. For example, a portion of the lower charge balance region 150, which vertically overlaps with the fourth edge pillar 138, may have a constant P-type impurity concentration along the direction distant from the drift layer 120. That is, the third and fourth regions 156 and 158 respectively disposed on the two fourth edge pillars 138 may have the same P-type impurity concentration.

In FIGS. 3A and 3B, it is exemplarily illustrated that, for convenience of illustration, 12 second portions 124 are disposed in the active region AR, and two pairs of the fourth edge pillars 138 are disposed at both sides of the active region AR, respectively. However, it can be understood that the number and width of second portions 124 and the width and number of fourth edge pillars 138 formed in the termination region TR may be changed based on a function, a size, and a use voltage of the superjunction semiconductor device 100B.

Figure 4A:
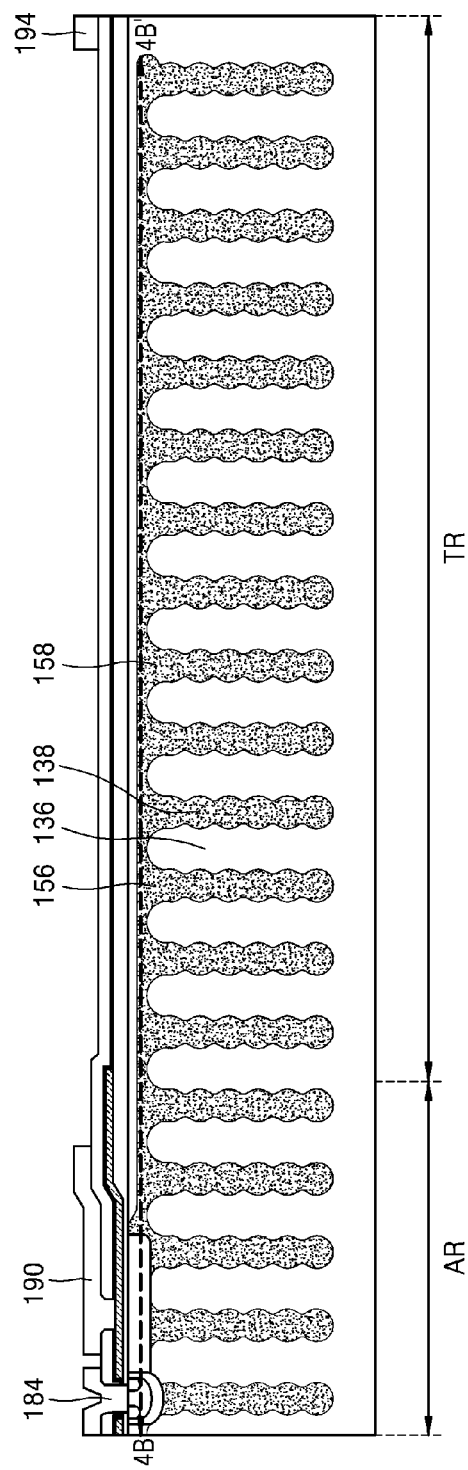
FIGS. 4A, 4B, and 4C illustrate a simulation result obtained through Experimental Example 1 of a superjunction semiconductor device according to exemplary embodiments.
Figure 4B:
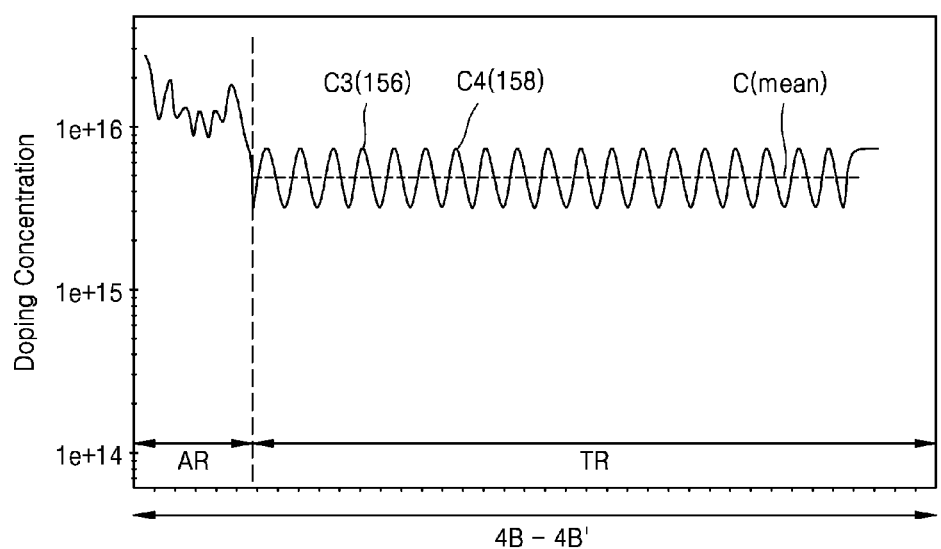
Figure 4C:
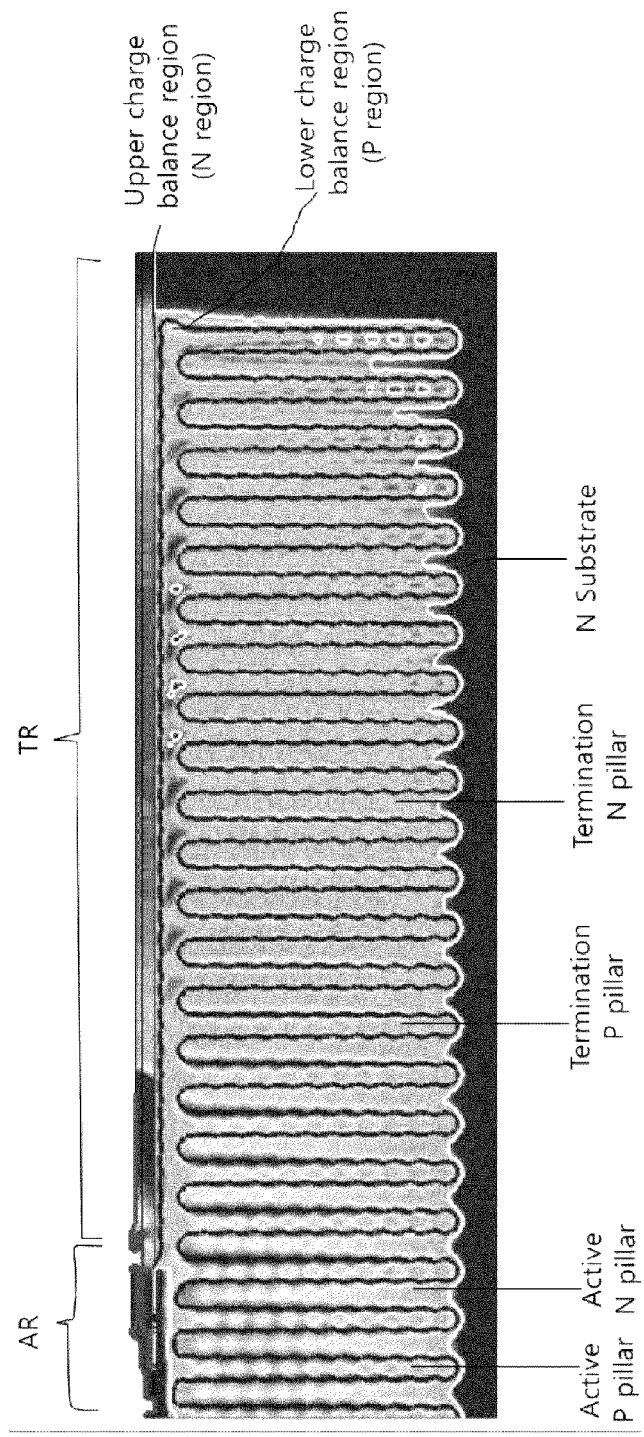

FIGS. 4A to 4C illustrate a simulation result obtained through Experimental Example 1 of a superjunction semiconductor device according to exemplary embodiments.

FIG. 4A illustrates a sectional view of Experimental Example 1 in which the width, height, and number of each of third and fourth edge pillars 136 and 138 are changed in the superjunction semiconductor device 100 described with reference to FIGS. 1A to 1C. According to Experimental Example 1 illustrated in FIG. 4A, the second height H2 of the lower edge region 130 is about 92% of the first height H1 of the drift layer 120.

FIG. 4B illustrates a P-type impurity concentration profile of the lower charge balance region 150 along line 4B-4B' of FIG. 4A. Referring to FIG. 4B, the lower charge balance region 150 may have an impurity concentration profile having a periodic increase/decrease along line 4B-4B'. In the impurity concentration profile, the maximum concentration within each period may correspond to the position of a portion of the lower charge balance region 150 under which a central portion of the fourth edge pillars 138 is disposed. However, the present disclosure is not limited thereto.

As described above, the lower charge balance region 150 may be formed by ion-implanting P-type impurities into an N-type epitaxial layer using an ion implantation mask including openings regularly arranged in a matrix form and laterally diffusing the implanted P-type impurities through a subsequent heat treatment process. In this case, the lower charge balance region 150 may have a P-type impurity concentration profile having a periodic increase/decrease. Here, the position of the opening may correspond to the maxim concentration point in each period within the impurity concentration profile. Therefore, when the central portion of the fourth edge pillars 138 does not vertically overlap with the opening of the ion implantation mask, the maximum concentration point in each period within the impurity concentration profile may not correspond to the position of the central portion of the fourth edge pillars 138.

Also, it can be seen that, in the impurity concentration profile, a mean impurity concentration C(mean) is maintained as a substantially constant value throughout the entire length along line 4B-4B' of the lower charge balance region 150. Also, it can be seen that a third concentration C3(156) of the third region 156 of the lower charge balance region 150 has the substantially same value as a fourth concentration C4(158) of the fourth region 158 of the lower charge balance region 150. When the openings of the ion implantation mask have the same width, the mean impurity concentration C(mean) can be constantly maintained in the impurity concentration profile.

FIG. 4C is a simulation result image illustrating an electric field distribution in an off state with respect to Experimental Example 1 of FIG. 4A. Referring to FIG. 4C, it can be seen that a relatively low electric field is applied throughout the entire area of the termination region TR. Particularly, a relatively high electric field is concentrated along a contact interface between the upper and lower charge balance regions 160 and 150. However, according to Experimental Example 1, the contact interface between the upper and lower charge balance regions 160 and 150 is disposed to be spaced apart by a predetermined depth from the top surface of the upper charge balance region 160, and the contact interface is not formed at the surface of the upper charge balance region 160. Thus, it can be seen that a low electric field is applied to the surface of the upper charge balance region 160.

Figure 5A:
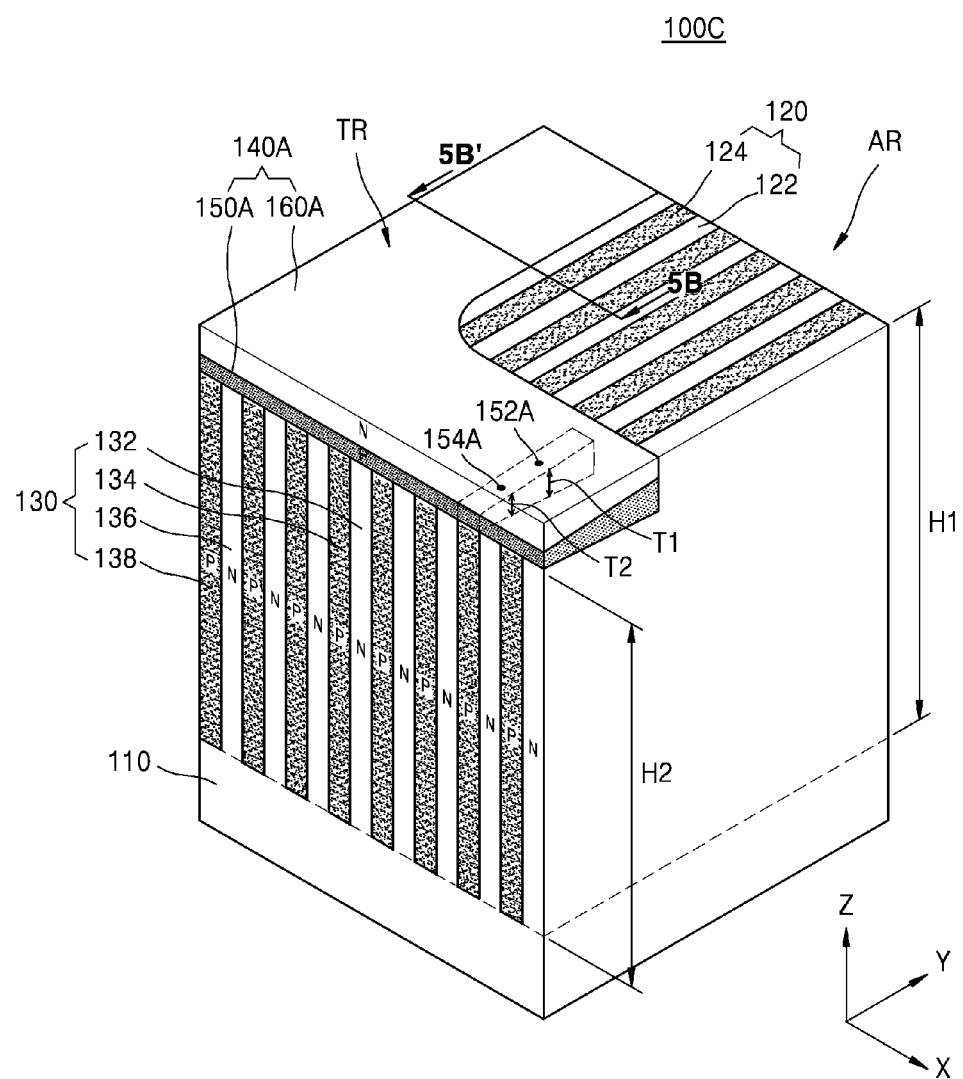
FIG. 5A is a perspective view illustrating a schematic configuration of a superjunction semiconductor device according to exemplary embodiments.
Figure 5B:
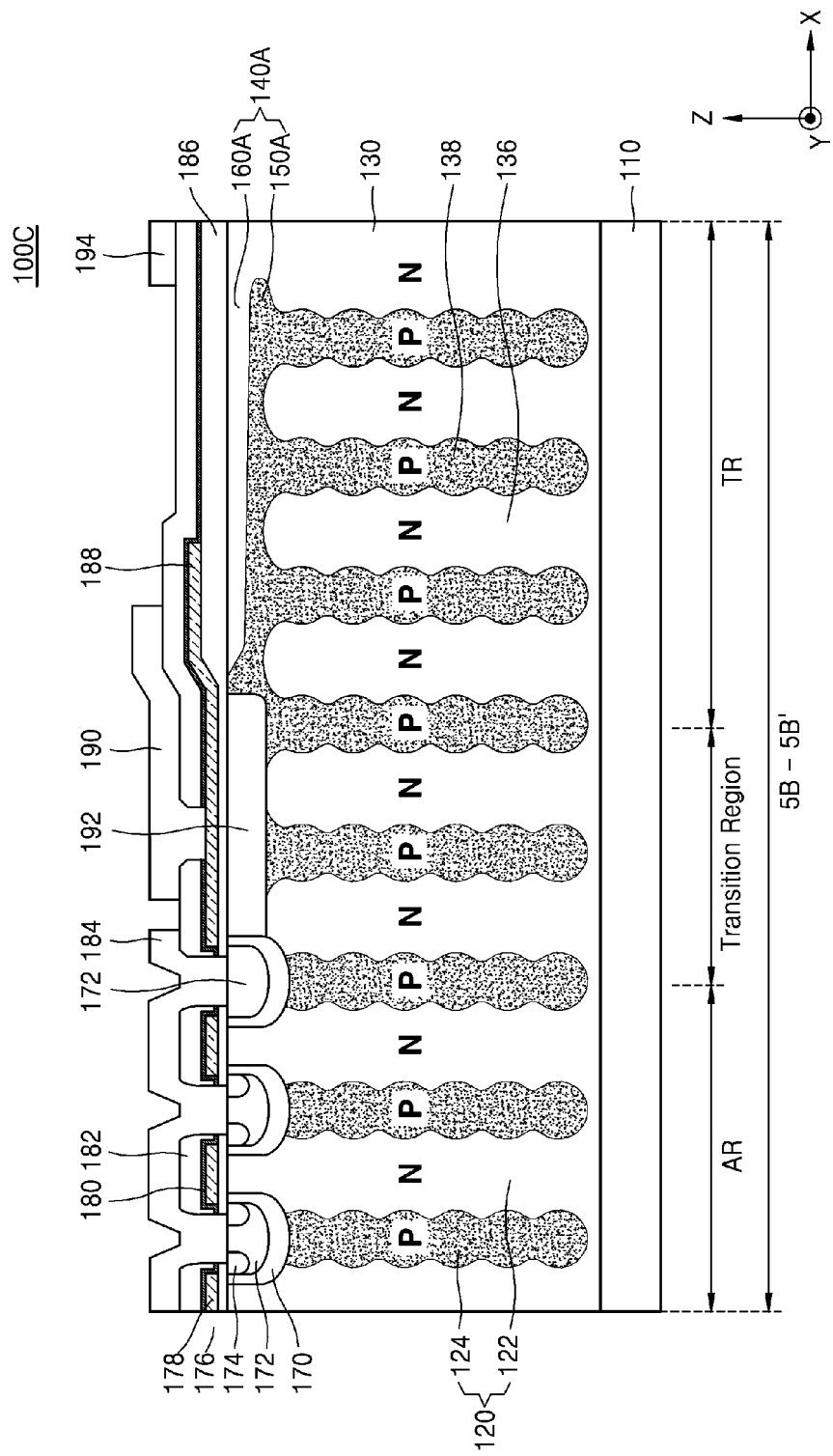
FIG. 5B is a sectional view taken along line 5B-5B' of FIG. 5A.

FIG. 5A is a perspective view illustrating a schematic configuration of a superjunction semiconductor device 100C according to exemplary embodiments, and FIG. 5B is a sectional view taken along line 5B-5B' of FIG. 5A. In FIGS. 5A and 5B, like reference numerals identical to those of FIGS. 1A to 3B designate the same members, and therefore, their detailed descriptions will be omitted herein.

Referring to FIGS. 5A and 5B, an upper edge region 140A may include a lower charge balance region 150A and an upper charge balance region 160A. The lower charge balance region 150A may include a first region 152A and a second region 154A, where the distance between the second region 154A and an active region AR may be greater than that between the first region 152A and the active region AR. The first region 152A and the second region 154A may have a first thickness T1 and a second thickness T2 along the vertical direction, respectively. The second thickness T2 may be smaller than the first thickness T1. As exemplarily shown in FIG. 5A, the thickness of the lower charge balance region 150A may gradually decrease as it becomes distant from the active region AR, but the present disclosure is not limited thereto. Also, as exemplarily shown in FIG. 5A, a contact interface between the upper and lower charge balance regions 160A and 150A may be inclined at a predetermined angle with respect to an X-Y plane.

As described above, the lower charge balance region 150A may be formed by ion-implanting P-type impurities into an N-type epitaxial layer using an ion implantation mask including openings regularly arranged in a matrix form and laterally diffusing the implanted P-type impurities through a subsequent heat treatment process. In this case, thickness of the lower charge balance region 150A may be changed depending on a width or spacing distance of the openings. Particularly, when the width of the openings decreases as it becomes distant from the active region AR and/or when the spacing distance of the openings increases as it becomes distant from the active region AR, as exemplarily shown in FIGS. 5A and 5B, the thickness of the lower charge balance region 150A may decrease as it becomes distant from the active region. However, the present disclosure is not limited thereto.

Figure 6A:
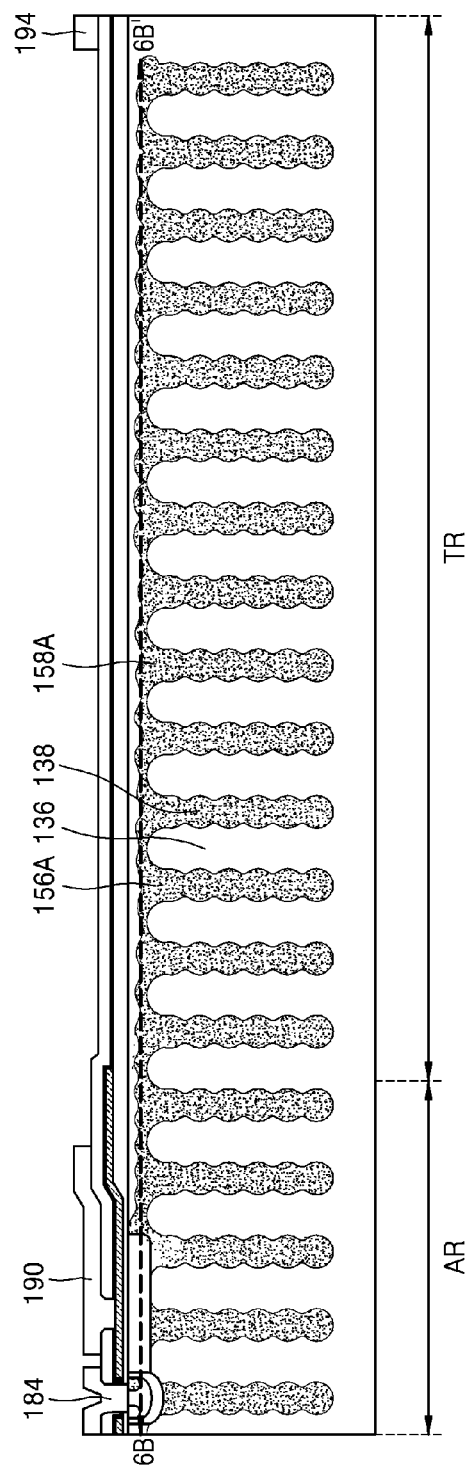
FIGS. 6A and 6B illustrate a simulation result obtained through Experimental Example 2 of a superjunction semiconductor device according to exemplary embodiments.
Figure 6B:
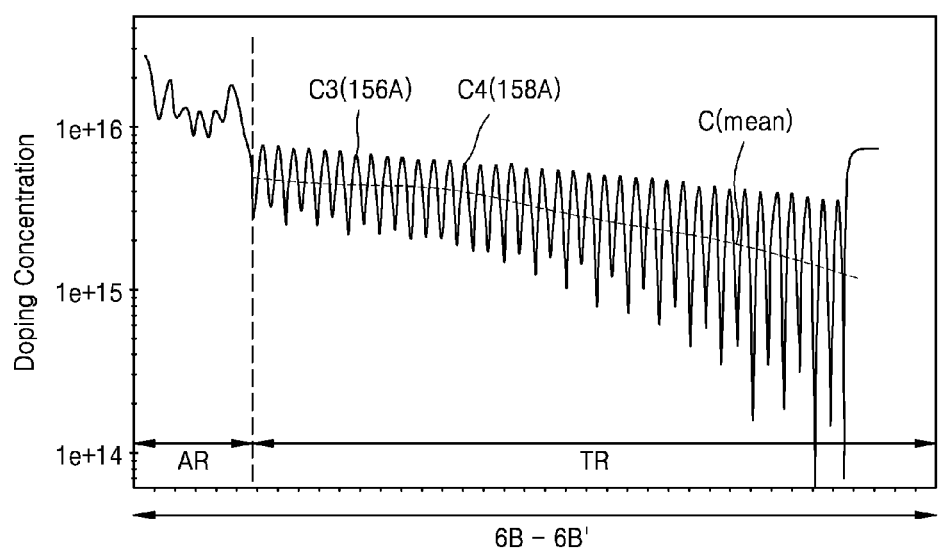

FIGS. 6A and 6B illustrate a simulation result obtained through Experimental Example 2 of a superjunction semiconductor device according to exemplary embodiments.

FIG. 6A illustrates a sectional view of Experimental Example 2 in which the width, height, and number of each of third and fourth edge pillars 136 and 138 are changed in the superjunction semiconductor device 100C described with reference to FIGS. 5A and 5B. According to Experimental Example 2 illustrated in FIG. 6A, the second height H2 of the lower edge region 130 is about 92% of the first height H1 of the drift layer 120.

FIG. 6B illustrates a P-type impurity concentration profile of the lower charge balance region 150A along line 6B-6B' of FIG. 6A. Referring to FIG. 6B, the lower charge balance region 150A may have an impurity concentration profile having a periodic increase/decrease along line 6B-6B'. It can be seen that, in the impurity concentration profile, the mean impurity concentration C(mean) gradually decreases as it becomes distant from the active region AR. Also, it can be seen that a third concentration C3(156A) of a third region 156A of the lower charge balance region 150A has a greater value than a fourth concentration C4(158A) of a fourth region 158A of the lower charge balance region 150A.

Figure 7:
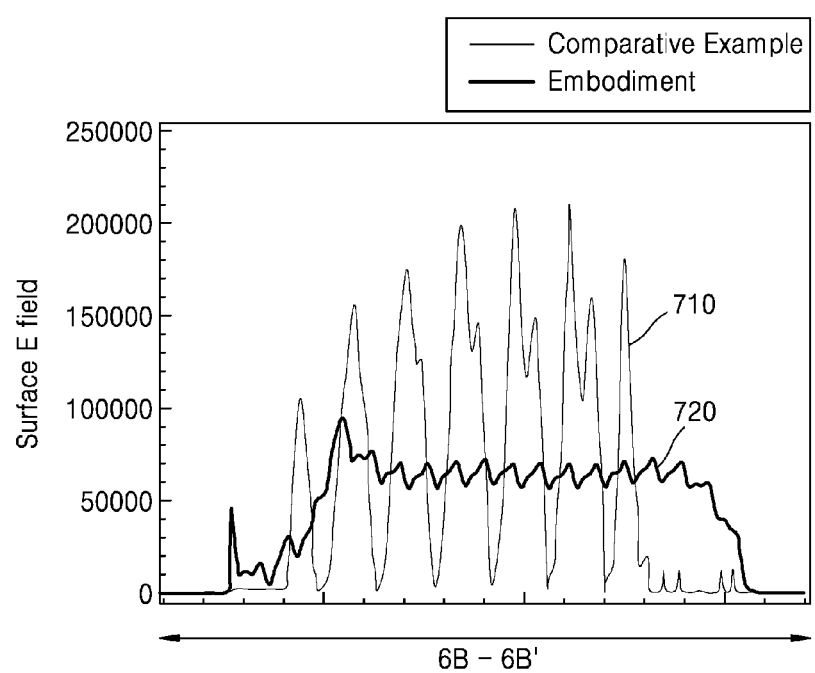
FIG. 7 is a graph illustrating a surface electric field profile of a superjunction semiconductor device according to exemplary embodiments.

FIG. 7 is a graph illustrating a surface electric field profile of a superjunction semiconductor device according to exemplary embodiments.

FIG. 7 illustrates surface electric field profiles through a simulation in an off state with respect to Experimental Example 2 described with reference to FIGS. 6A and 6B and Comparative Example. Comparative Example 710 uses a structure in which a plurality of N-type and P-type pillars are alternately disposed in a termination region, and a plurality of poly field plates are disposed on a field oxide layer so as to prevent an electric field from being suddenly changed in the termination region.

Referring to FIG. 7, it can be seen that while a suddenly high electric field is periodically applied in Comparative Example 710, a relatively low electric field is gradually applied throughout the entire surface in Embodiment 720.

As described above, in Embodiment 720, the lower and upper charge balance regions can form a P-N junction structure disposed in the vertical direction, a high electric field applied to a junction surface of the P-N junction structure (or the interface between the lower and upper charge balance regions) is located to be spaced apart from the top surface of the upper charge balance region. Hence, it can be understood that the electric field applied to the surface of the upper charge balance region decreases.

Also, as described above, the N-type and P-type pillars are alternately disposed in the termination region of Comparative Example 710 and extend in one direction, and the transmission of an electric field along the extending direction is considerably fast (i.e., a phenomenon that electric fields are asymmetrically transmitted). Hence, a portion of the termination region, disposed along the extending direction, may become a weak portion to which a high electric field is locally applied. On the other hand, any P-type and N-type pillars are not formed on an upper surface of Embodiment 720. Thus, it can be understood to prevent the phenomenon that electric fields are asymmetrically transmitted by the pillars, and a relatively low electric field can be uniformly applied throughout the entire surface of the upper charge balance region.

As described above, connection region pillars are disposed to surround the N-type and P-type pillars of the active region in the termination region of Comparative Example 710, and therefore, a weak portion may be generated due to local charge imbalance. On the other hand, in Embodiment 720, the lower charge balance region may be formed throughout the substantially entire area of the termination region through a heat treatment process for ion-implantation P-type impurities using an ion implantation mask in which openings are regularly arranged and diffusing the P-type impurities. Thus, it can be understood that excellent charge balance can be obtained around the active region, and hence an electric field can be stably transmitted at an interface portion between the active region and the termination region.

FIGS. 8A to 18 are views illustrating a method of manufacturing the superjunction semiconductor device 100 according to exemplary embodiments. Specifically, FIGS. 8A, 9 to 13, 14A, and 15 to 18 are sectional views corresponding to the section along line 1C-1C' of FIG. 1A, and FIGS. 8B and 14B are top views illustrating masks 210_1 and 210_7 described in FIGS. 8A and 14A.

Figure 8A:
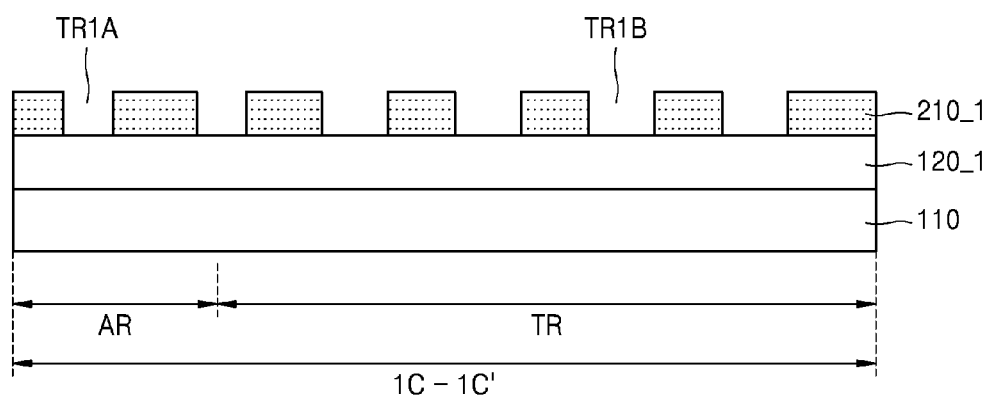
Figure 8B:
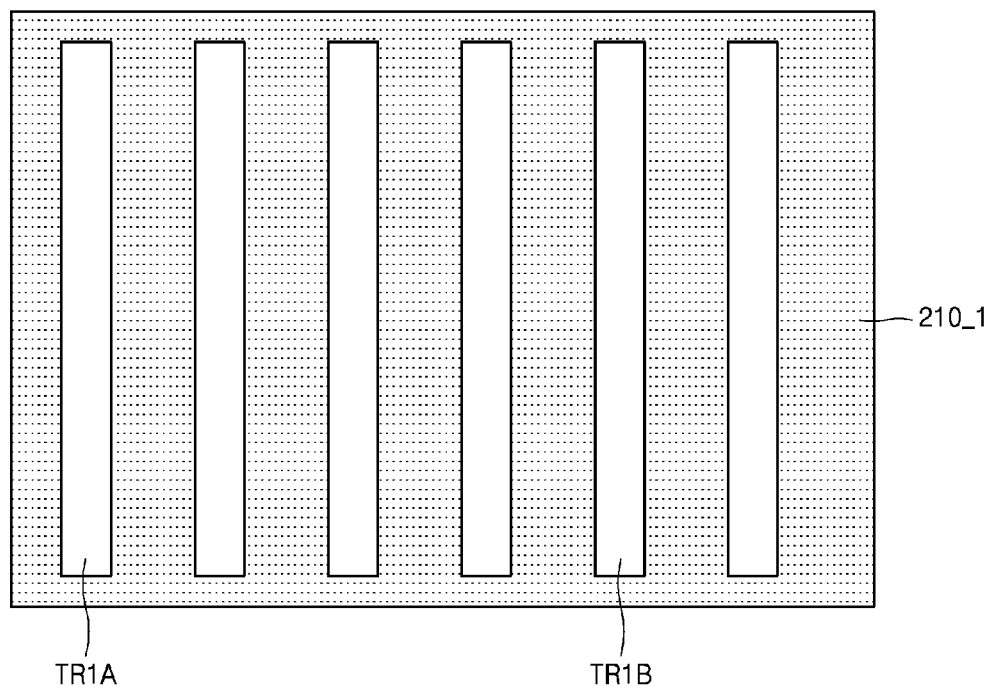

Referring to FIGS. 8A and 8B, a first epitaxial layer 120_1 may be formed on a first semiconductor layer 110 divided into an active region and a termination region TR, and a first mask 210_1 may be disposed on the first epitaxial layer 120_1.

In exemplary embodiments, the first semiconductor layer 110 may be a portion of a semiconductor substrate doped with an N-type impurity. Alternatively, the first semiconductor layer 110 may include a semiconductor substrate and an epitaxial layer formed on the semiconductor substrate, the epitaxial layer being doped with an N-type impurity.

The first epitaxial layer 120_1 may be a semiconductor layer including an N-type impurity. In a growth process of the first epitaxial layer 120_1, the first epitaxial layer 120_1 may be doped with an N-type impurity such as arsenic (As) or phosphorus (P).

The first mask 210_1 may include a plurality of first active trenches TR1A and a plurality of first edge trenches TR1B. The plurality of first active trenches TR1A may expose a top surface of the first epitaxial layer 120_1 of the active region AR therethrough, and the plurality of first edge trenches TR1B may expose a top surface of the first epitaxial layer 120_1 of the termination region TR therethrough.

Figure 9:
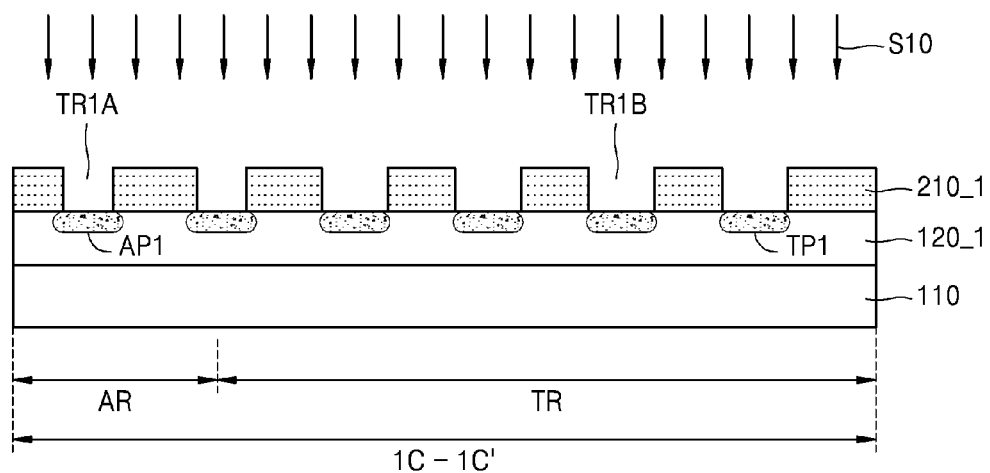

Referring to FIG. 9, a P-type impurity such as boron (B) may be implanted in a predetermined dose into a portion of the first epitaxial layer 120_1, which is not covered by the first mask 210_1 by performing a first ion implantation process S10. Accordingly, a plurality of first preliminary active pillar layers AP1 can be formed at upper portions of the first epitaxial layer 120_1 of the active region AR, exposed by the plurality of first active trenches TR1A, and a plurality of first preliminary edge pillar layers TP1 can be formed at upper portions of the first epitaxial layer 120_1 of the termination region TR, exposed by the plurality of first edge trenches TR1B.

After that, the first mask 210_1 may be removed.

Figure 10:
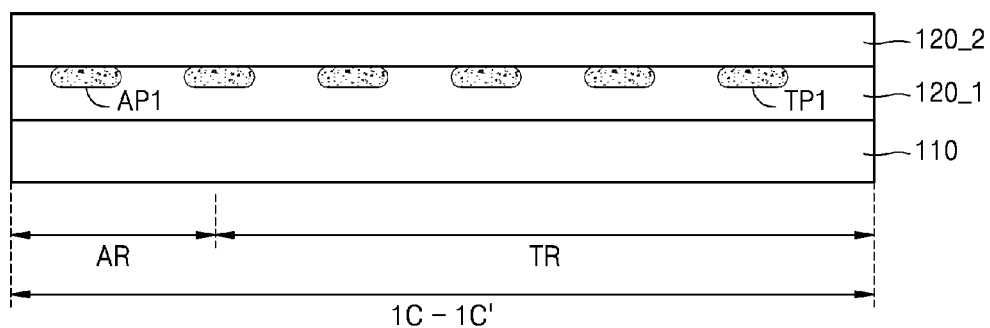

Referring to FIG. 10, a second epitaxial layer 120_2 may be formed on the first epitaxial layer 120_1 in which the plurality of first preliminary active pillar layers AP1 and the plurality of first preliminary edge pillar layers TP1 are formed. The second epitaxial layer 120_2 may be formed by performing the same process as the first epitaxial layer 120_1. The second epitaxial layer 120_2 may be formed to have the same thickness as the first epitaxial layer 120_1, but the present disclosure is not limited thereto.

Figure 11:
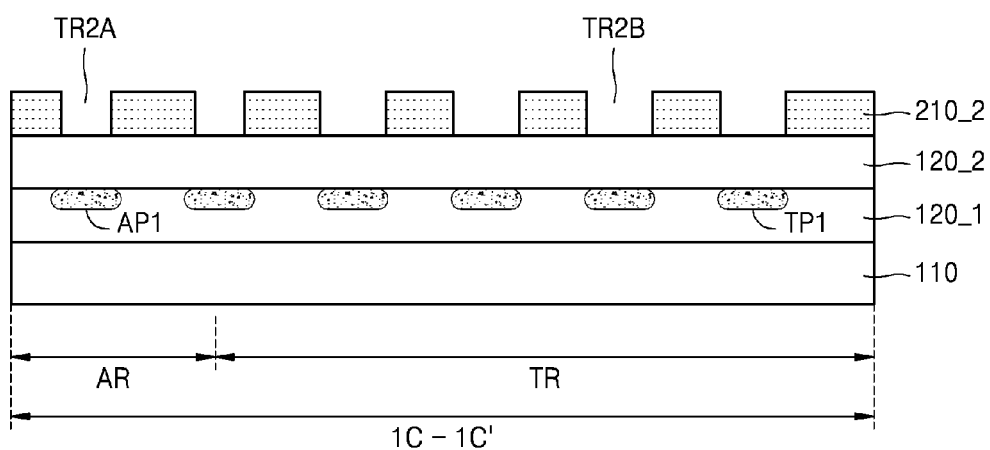

Referring to FIG. 11, a second mask 210_2 may be disposed on the second epitaxial layer 120_2. The second mask 210_2 may be similar to the first mask 210_1 described with reference to FIG. 8A. The second mask 210_2 may include a plurality of second active trenches TR2A and a plurality of second edge trenches TR2B.

Figure 12:
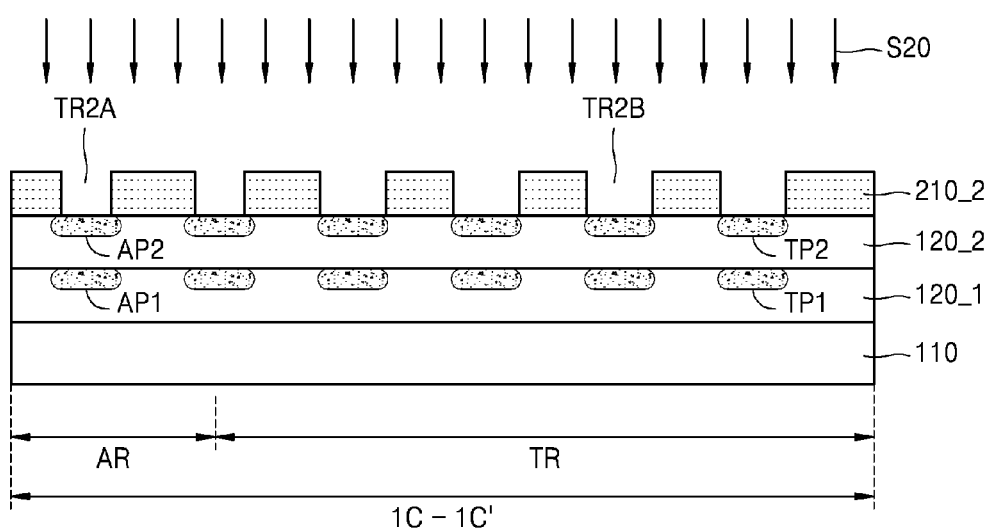

Referring to FIG. 12, a P-type impurity such as boron (B) may be implanted in a predetermined dose into a portion of the second epitaxial layer 120_2, which is not covered by the second mask 210_2, by performing a second ion implantation process S20. Accordingly, a plurality of second preliminary active pillar layers AP2 can be formed at upper portions of the second epitaxial layer 120_2 of the active region AR, exposed by the plurality of second active trenches TR2A, and a plurality of second preliminary edge pillar layers TP2 may be formed at upper portions of the second epitaxial layer 120_2 of the termination region, exposed by the plurality of second edge trenches TR2B.

After that, the second mask 210_2 may be removed.

A structure shown in FIG. 13 can be obtained by repeating, several times, the processes described with reference to FIGS. 10 to 12.

Figure 13:
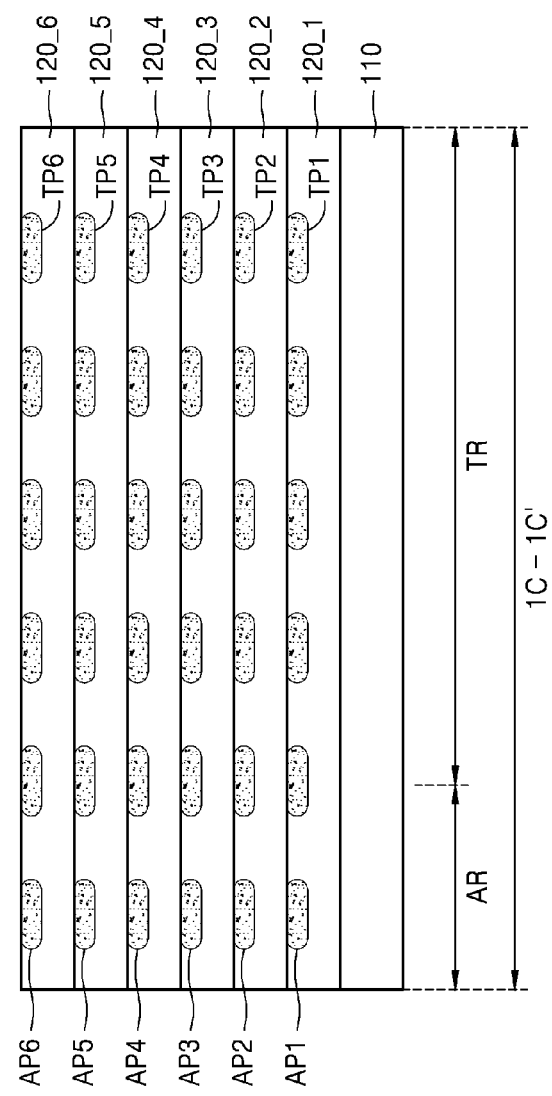

Referring to FIG. 13, first to sixth preliminary active pillar layers AP1, AP2, AP3, AP4, AP5, and AP6 and first to sixth preliminary edge pillar layers TP1, TP2, TP3, TP4, TP5, and TP6 may be formed in first to sixth epitaxial layers 120_1, 120_2, 120_3, 120_4, 120_5, and 120_6, respectively.

Figure 14A:
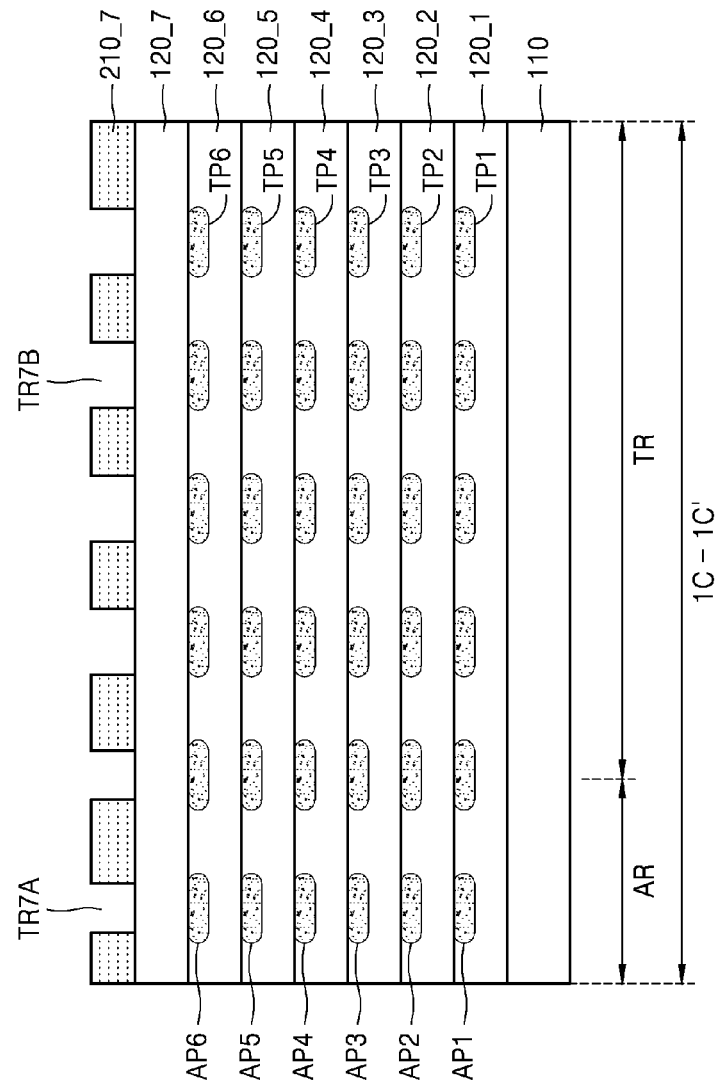
Figure 14B:
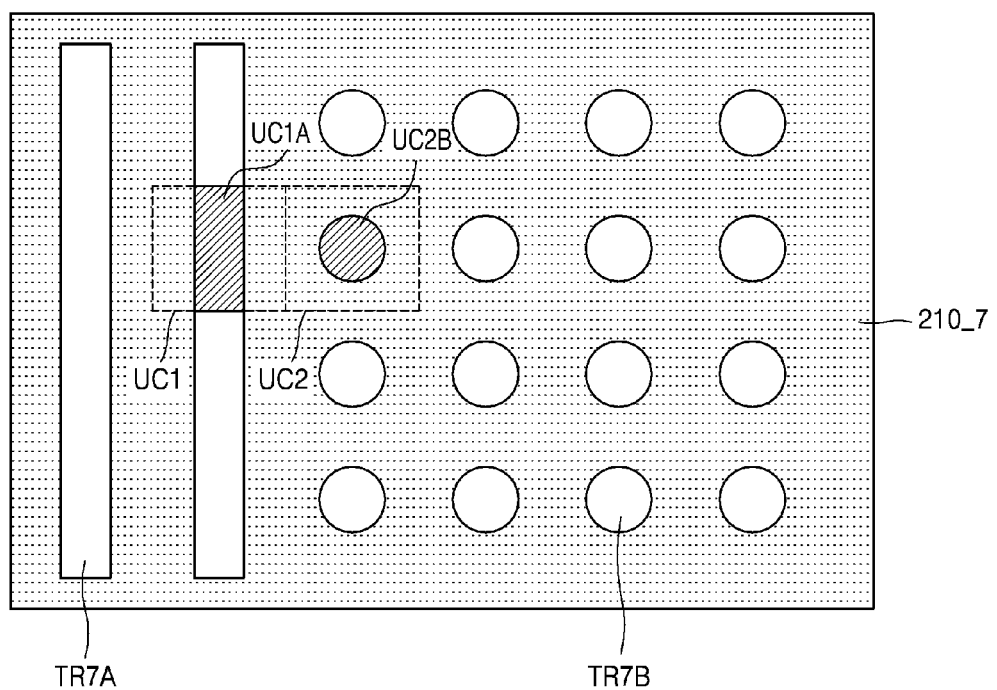

Referring to FIGS. 14A and 14B, a seventh epitaxial layer 120_7 may be formed on the sixth epitaxial layer 120_6. A seventh mask 210_7 may be disposed on the seventh epitaxial layer 120_7.

The seventh mask 210_7 may include a plurality of seventh active trenches TR7A and a plurality of edge openings TR7B.

The plurality of seventh active trenches TR7A may be similar to the first active trench TR1A of the first mask 210_1. The plurality of seventh active trenches TR7A may have a line shape extending in one direction.

In exemplary embodiments, the plurality of edge openings TR7B may be a plurality of holes regularly arranged in a matrix form. In FIG. 14A, it is exemplarily illustrated that the plurality of edge openings TR7B have a circular section along the horizontal direction, but the present disclosure is not limited thereto. The plurality of edge openings TR7B may have various horizontal sectional shapes such as an elliptical shape, a quadrangular shape, a rectangular shape, a square shape, a rhombic shape, a triangular shape, a pentagonal shape, a hexagonal shape, an octagonal shape, etc.

In exemplary embodiments, the size of each of the plurality of edge openings TR7B may be determined based on a width of the plurality of seventh active trenches TR7A. For example, when the plurality of edge openings TR7B have a circular section, one edge opening TR7B is disposed in a second unit cell UC2, and a first radius $R_1$ of the edge opening TR7B may be determined such that an area UC1A of the seventh active trench TR7A disposed in a first unit cell UC1 is the same as an area UC2B of the edge opening TR7B disposed in the second unit cell UC2. Specifically, when the length of one side of the unit cell UC1 is defined as a cell pitch $P_{cell}$, and the seventh active trench TR7A has a trench width $W_{TR}$, the first radius $R_1$ of the edge opening TR7B may satisfy the following equation.

$$\pi \times R_1^2 = P_{cell} \times W_{TR}$$

As described above, a weak portion may be generated in the vicinity of a boundary between the active region and the termination region due to charge imbalance. However, in the present disclosure, when a plurality of edge openings TR7B are disposed to have the same area as the seventh active trench TR7A in the unit cells UC1 and UC2, charge balance can be effectively obtained. When the plurality of edge openings TR7B have a circular section, the centers of the plurality of edge openings TR7B are disposed at the center of the second unit cell UC2, so that the first radius R1 of the edge opening TR7B, the cell pitch Pcell, and the like can be easily calculated to obtain the charge balance.

Referring to FIG. 15, a P-type impurity such as boron (B) may be implanted in a predetermined dose into a portion of the seventh epitaxial layer 120_7, which is not covered by the seventh mask 210_7, by performing a seventh ion implantation process S70. Accordingly, a plurality of seventh preliminary active pillar layers AP7 can be formed at upper portions of the seventh epitaxial layer 120_7 of the active region AR, exposed by the plurality of seventh active trenches TR7A, and a plurality of preliminary charge balance layers TP7 can be formed at upper portions of the seventh epitaxial layer 120_7 of the termination region TR, exposed by the plurality of edge openings TR7B.

In exemplary embodiments, the plurality of edge openings TR7B may have the first radius $R_1$ greater than the cell pitch $P_{cell}$. As exemplarily shown in FIG. 15, the width of each of the plurality of preliminary charge balance layers TP7 may be greater than the trench width $W_{TR}$ of the plurality of seventh preliminary active pillar layers AP7.

After that, the seventh mask 210_7 may be removed.

Figure 16:
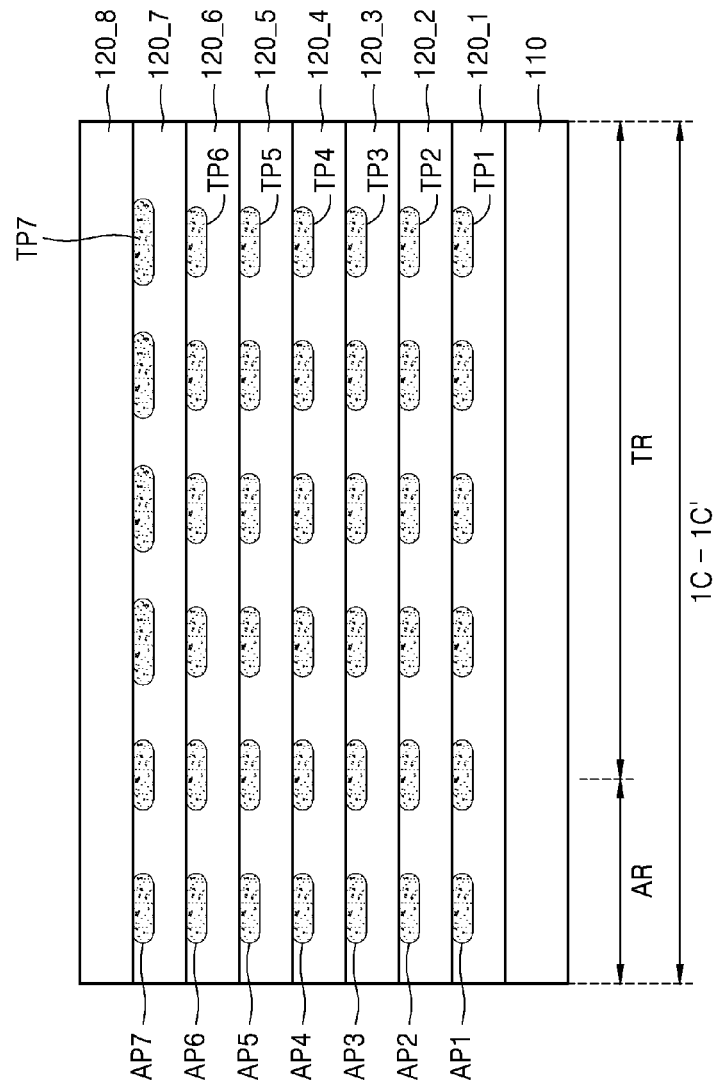

Referring to FIG. 16, an eighth epitaxial layer 120_8 may be formed on the seventh epitaxial layer 120_7. In exemplary embodiments, the thickness of the eighth epitaxial layer 120_8 may be formed smaller than that of the seventh epitaxial layer 120_7.

Referring to FIG. 17, an annealing process may be performed on a structure in which the eighth epitaxial layer 120_8 is formed, thereby diffusing impurities implanted into the first to seventh preliminary active pillar layers AP1, AP2, . . . AP6, and AP7 (see FIG. 16), the first to sixth preliminary edge pillar layers TP1, TP2, . . . , TP5, and TP6 (see FIG. 16), and the preliminary charge balance layer TP7 (see FIG. 16), which are formed in the structure.

In exemplary embodiments, portions of the first to eighth epitaxial layers 120_1, 120_2, . . . , 120_7, and 120_8, located in the active region AR, may be referred to as a drift layer 120, and portions of the first to sixth epitaxial layers 120_1, 120_2, . . . , 120_5, and 120_6, located in the termination region TR, may be referred to as a lower edge region 130.

In exemplary embodiments, the impurities may be diffused by a predetermined distance in the horizontal direction and/or the vertical direction through the annealing process, and accordingly, the first to seventh preliminary active pillar layers AP1, AP2, . . . , AP6, and AP7 are connected to each other along the vertical direction, to form a second portion 124 extending in one direction. A portion of the drift layer 120, located between adjacent two second portions 124 may be referred to as a first portion 122.

In addition, the first to sixth preliminary edge pillar layers TP1, TP2, . . . , TP5, and TP6 are connected to each other along the vertical direction through the annealing process, to form P-type edge pillars in the lower edge region 130. A portion of the lower edge region 130, located between the P-type edge pillars, may be referred to as N-type edge pillars.

The impurities implanted into the preliminary charge balance layer TP7 are diffused in the horizontal direction and/or the vertical direction, and overlap with the impurities implanted into an adjacent preliminary charge balance layer TP7, thereby forming a lower charge balance region 150. A portion of the eighth epitaxial layer 120_8, disposed on the lower charge balance region 150, may be referred to as an upper charge balance region 160. In exemplary embodiments, the lower charge balance region 150 may be formed through the substantially entire area of the termination region TR, and the upper charge balance region 160 may vertically overlap with the lower charge balance region 150 throughout the substantially entire area of the termination region TR.

As the impurities are diffused in the horizontal direction through the annealing process, the concentration of P-type impurities included in the lower charge balance region 150 may be smaller that that of P-type impurities included in the first portion 122 of the active region AR. In addition, as the impurities are diffused in the horizontal direction through the annealing process, the lower change balance region 150 is formed. Therefore, the lower charge balance area 150 may have a P-type impurity concentration profile having a periodic increase/decrease.

In general, as the concentration of impurities in a termination region decreases, the breakdown voltage of a semiconductor device may increase. Accordingly, the concentration of impurities in the termination region is smaller than that of impurities included in a P-type pillar of an active region, which may be advantageous to improve the breakdown voltage. In order to form impurity regions having different impurity concentrations in the active region and the termination region, which are located on the same level, it is generally required to perform ion implantation processes twice using different ion implantation doses. However, in the present disclosure, the active region AR and the termination region TR, which have different impurity concentrations, can be simultaneously formed through only one-time ion implantation process, using the seventh mask 210_7 including the stripe-shaped trenches TR7A for the active region AR and the circular openings TR7B for the termination region TR. Accordingly, processes can be simplified, and manufacturing cost can be reduced.

Referring to FIG. 18, additional ion implantation processes for forming a P body region 170, a P+ region 172, and an N+ region 174 may be performed on the active region AR. An oxidation process for forming a gate dielectric layer 176 and a field oxide layer 186, a deposition and patterning process for forming an active poly gate layer 178 and a field plate 188, a deposition and patterning process for forming a spacer 180 and an insulating layer 182, a deposition and patterning process for forming a source electrode 184, a gate electrode 190, and a floating electrode 194, and the like may be performed before or after the ion implantation processes or between the ion implantation processes.

The above-described processes are performed, thereby completing the superjunction semiconductor device 100 shown in FIG. 18.

Figure 19A:
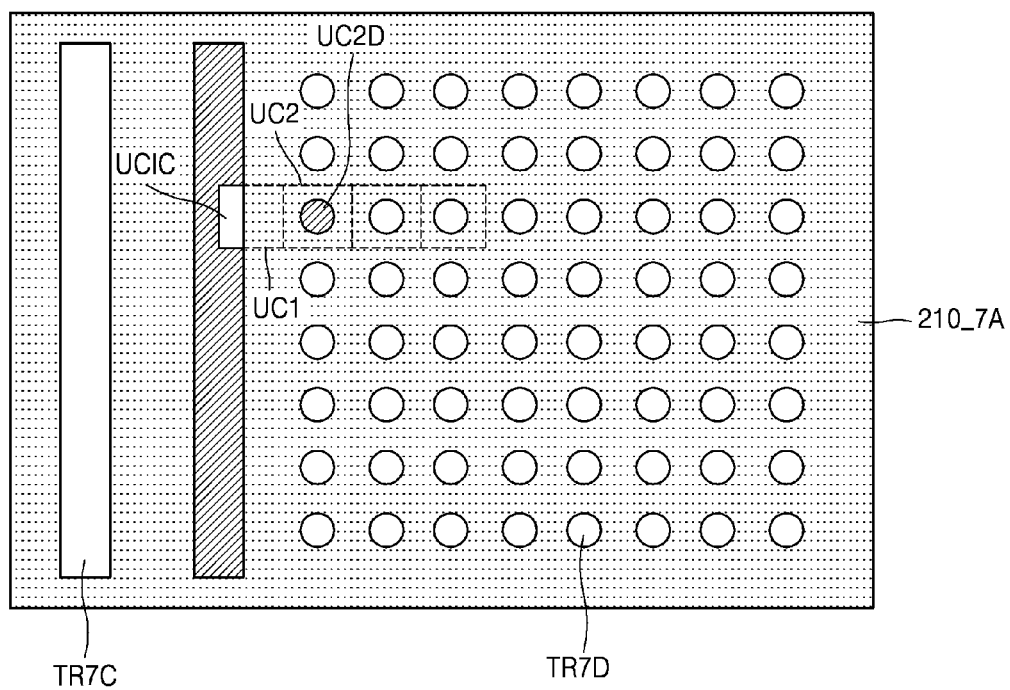
FIGS. 19A, 19B, and 20 are plan and sectional views illustrating a method of manufacturing a superjunction semiconductor device according to exemplary embodiments.
Figure 19B:
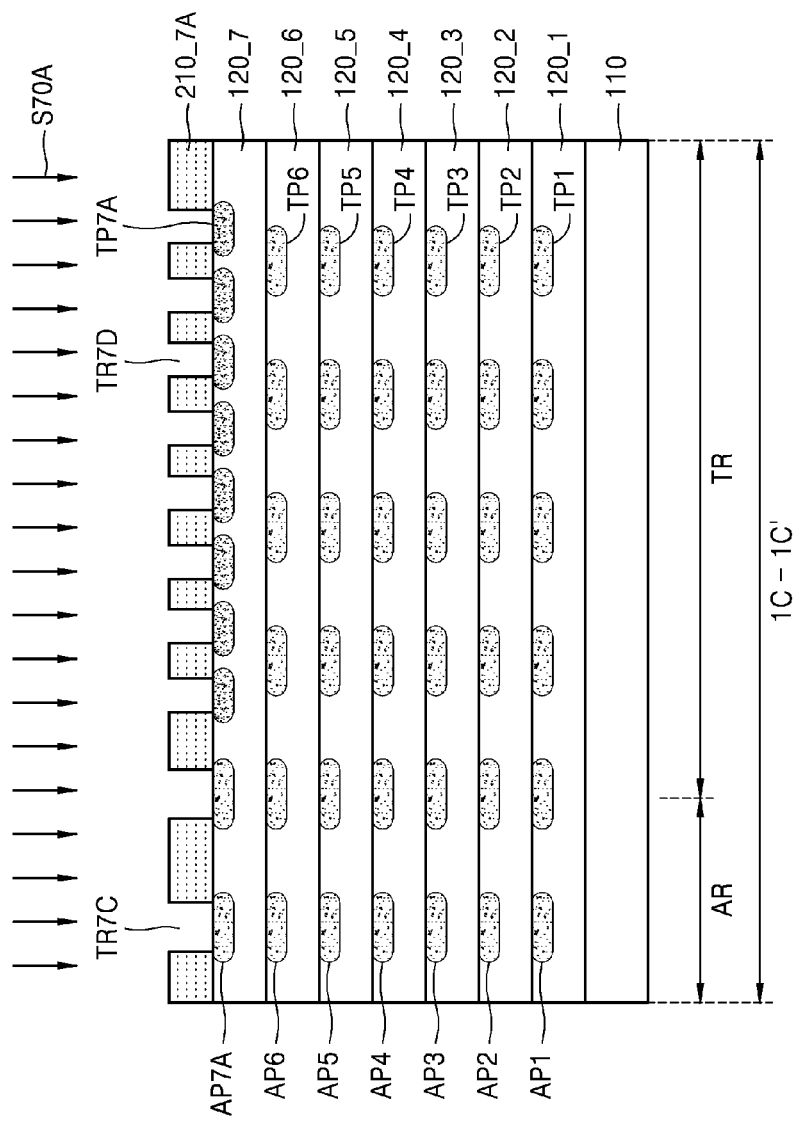
Figure 20:
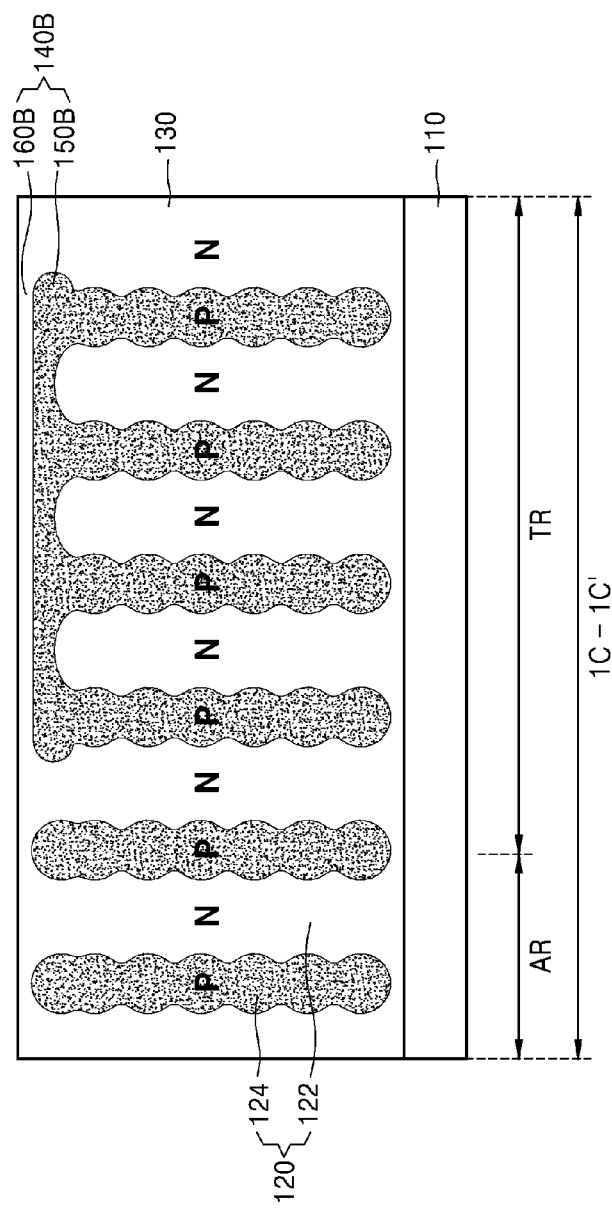

FIGS. 19A to 20 are plan and sectional views illustrating a method of manufacturing the superjunction semiconductor device 100 according to exemplary embodiments. The method is similar to a method of manufacturing the superjunction semiconductor device 100, described with reference to FIGS. 8A to 18, except the shape of a seventh mask 210_7A.

Referring to FIG. 19A, the seventh mask 210_7A may include a plurality of seventh active trenches TR7C and a plurality of edge openings TR7D.

In exemplary embodiments, the plurality of edge openings TR7D may be a plurality of holes regularly arranged in a matrix form. The plurality of edge openings TR7D may be formed to have a smaller radius than the edge openings TR7D formed in the seventh mask 210_7 described with reference to FIG. 14A.

For example, a second radius $R_2$ of the edge opening TR7D may be determined such that an area UC1C of the seventh active trench TR7C disposed in a first unit cell UC1 is the same as an area UC2D of the edge opening TR7D disposed in the second unit cell UC2. Specifically, when the sum of a distance between the seventh active trenches TR7C and a trench width WTR of the seventh active trench TR7C is defined as a cell pitch $P_{cell}$, and the seventh active trench TR7C has the trench width $W_{TR}$, the second radius $R_2$ of the edge opening TR7D may satisfy the following equation.

$$\pi \times R_2^2 = P_{cell}/2 \times W_{TR}/2$$

As described above, a weak portion may be generated in the vicinity of a boundary between the active region and the termination region due to charge imbalance. However, in the present disclosure, when a plurality of edge openings TR7D are disposed to have the same area as the seventh active trench TR7C in the unit cells UC1 and UC2, charge balance can be effectively obtained. When the plurality of edge openings TR7D have a circular section, the centers of the plurality of edge openings TR7D are disposed at the center of the second unit cell UC2, so that the second radius $R_2$ of the edge opening TR7D, the cell pitch $P_{cell}$, and the like can be easily calculated to obtain the charge balance.

Referring to FIG. 19B, a seventh ion implantation process S70A is performed using the seventh mask 210_7, so that a plurality of seventh preliminary active pillar layers AP7A are formed in the active region AR and a plurality of preliminary charge balance layers TP7A are formed in the termination region TR.

Referring to FIG. 20, an annealing process may be performed on a structure in which the plurality of seventh preliminary active pillar layers AP7A and the plurality of preliminary charge balance layers TP7A are formed.

Impurities implanted into the preliminary charge balance layer TP7A are diffused in the horizontal direction and/or the vertical direction through the annealing process, and overlap with impurities implanted into an adjacent preliminary charge balance layer TP7A, thereby forming a lower charge balance region 150B. In exemplary embodiments, the lower charger balance region 150B may be formed throughout the substantially entire area of the termination region TR. A portion of the eighth epitaxial layer 120_8, disposed on the lower charge balance region 150B, may be referred to as an upper charge balance region 160B.

After that, the process described with reference to FIG. 18 is performed, thereby completing the superjunction semiconductor device 100.

FIGS. 21A to 23 are views illustrating a method of manufacturing a superjunction semiconductor device 100D according to exemplary embodiments. The method is similar to a method of manufacturing the superjunction semiconductor device 100, described with reference to FIGS. 8A to 18, except the shape of a seventh mask 210_7B.

Figure 21A:
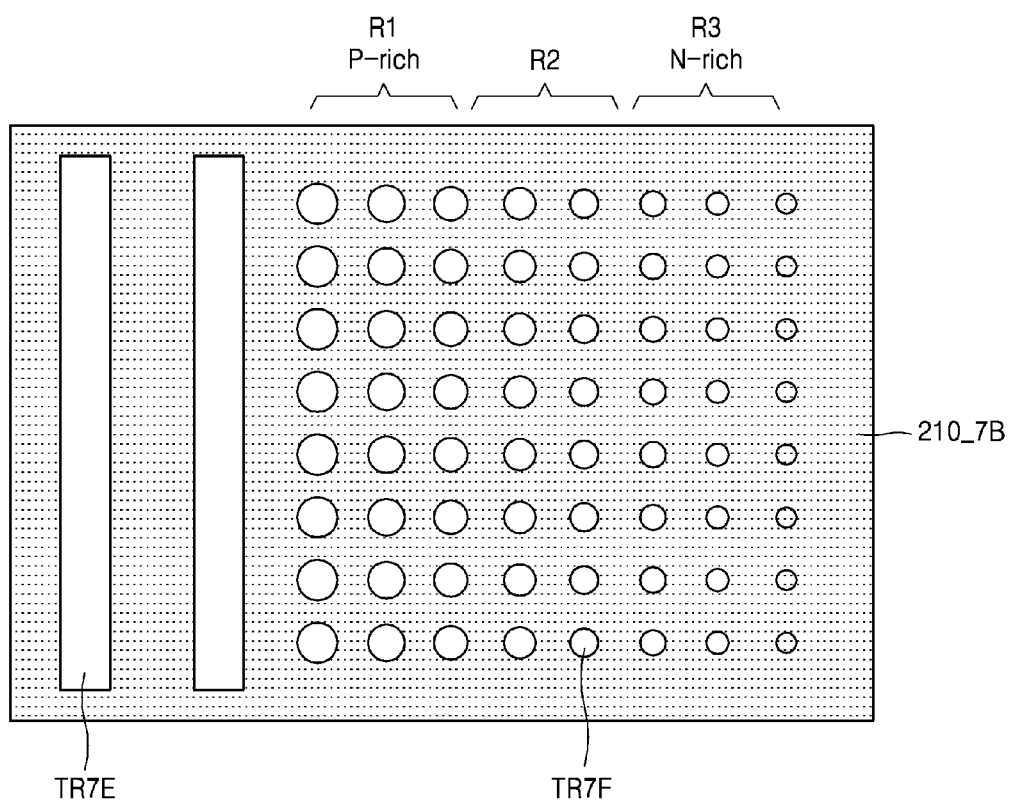
FIGS. 21A, 21B, 22, and 23 are views illustrating a method of manufacturing a superjunction semiconductor device according to exemplary embodiments.

Referring to FIG. 21A, the seventh mask 210_7B may include a plurality of seventh active trenches TR7E and a plurality of edge openings TR7F.

In exemplary embodiments, the plurality of edge openings TR7F may have a circular section having a third radius $R_3$ that gradually becomes small as it becomes distant from the plurality of seventh active trenches TR7E.

Therefore, the seventh mask 210_7B may include a first edge mask region R1, a second edge mask region R2, and a third edge mask region R3, which are sequentially disposed along a direction in which its distance becomes distant from the plurality of seventh active trenches TR7E. The first edge mask region R1 may be a mask region for forming a P-rich region having a relatively high P-type impurity concentration, and the third edge mask region R3 may be a mask region for forming an N-rich region having a relatively high N-type impurity concentration.

Figure 21B:
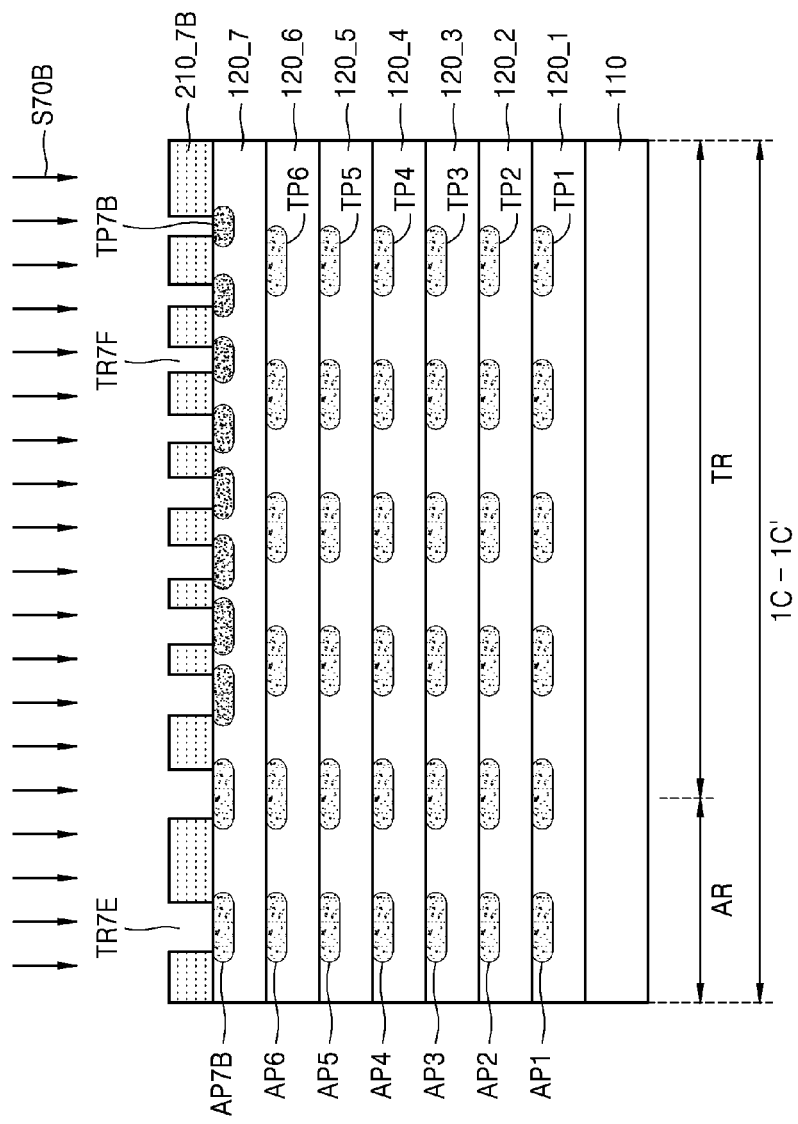

Referring to FIG. 21B, a seventh ion implantation process S70B is performed using the seventh mask 210_7B, so that a plurality of seventh preliminary active pillar layers AP7B can be formed in an active region and a plurality of preliminary charge balance layers TP7B can be formed in a termination region. Meanwhile, a portion of the preliminary charge balance layer TP7B, exposed by the first edge mask region R1, may become a P-rich region having a relatively high P-type impurity concentration, and a portion of the preliminary charge balance layer TP7B, exposed by the third edge mask region R3, may become an N-rich region having a relatively high N-type impurity concentration.

Figure 22:
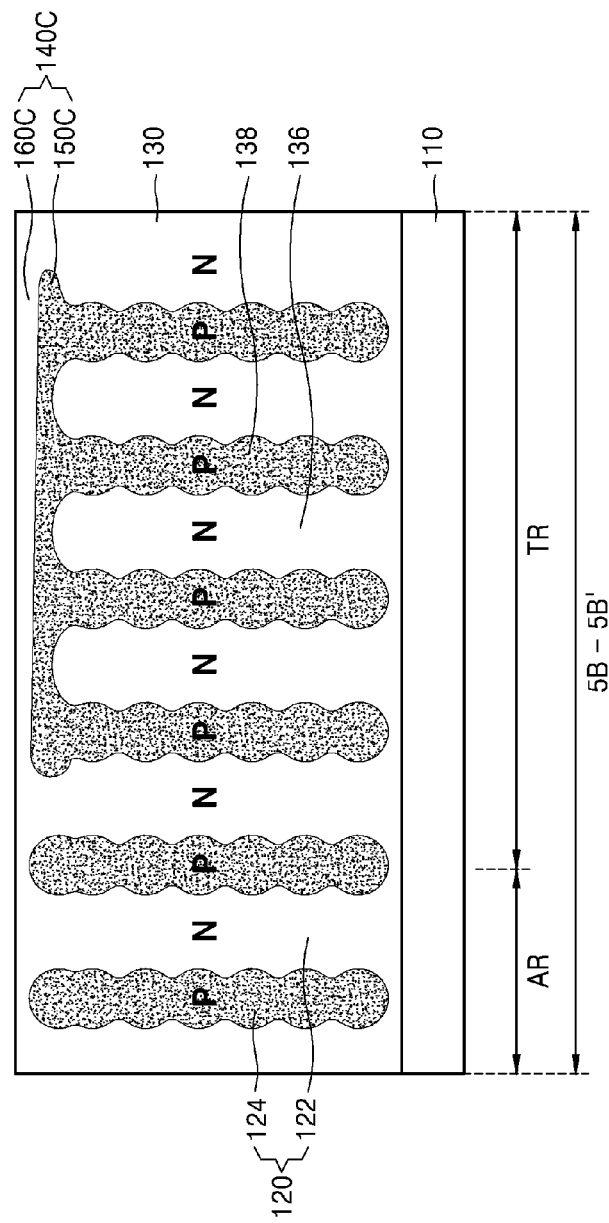

Referring to FIG. 22, an annealing process may be performed on a structure in which the plurality of seventh preliminary active pillar layers AP7B and the plurality of preliminary charge balance layers TP7B are formed.

Impurities implanted into the preliminary charge balance layer TP7B are diffused in the horizontal direction and/or the vertical direction through the annealing process, and overlap with impurities implanted into an adjacent preliminary charge balance layer TP7B, thereby forming a lower charge balance region 150C. In exemplary embodiments, as the concentration of P-type impurities included in the preliminary charge balance layer TP7B gradually decreases as it becomes distant from the active region AR, the lower charge balance region 150C may have a thickness that gradually decreases as it becomes distant from the active region AR.

Figure 23:
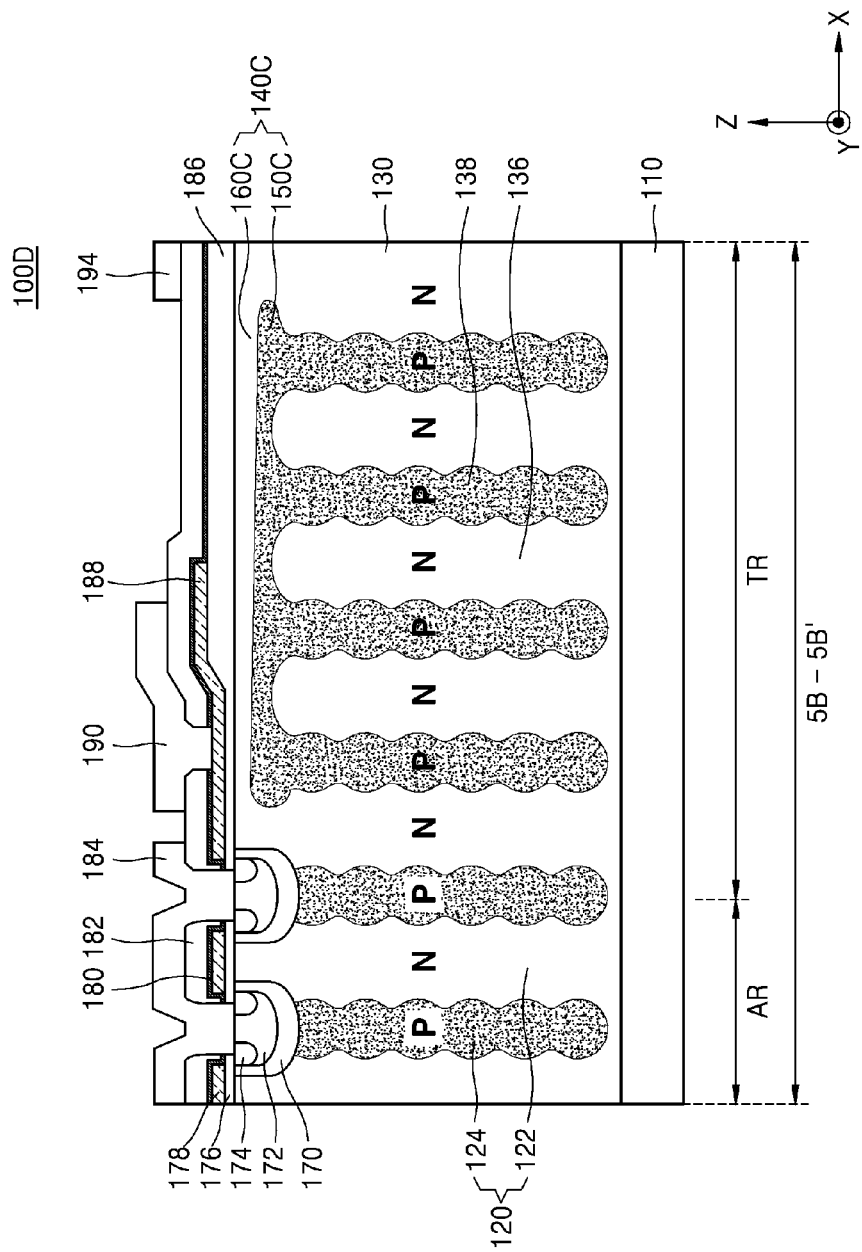

Referring to FIG. 23, the process described with reference to FIG. 18 is performed, thereby completing the superjunction semiconductor device 100D.

Although preferred embodiments of the present disclosure have been shown and described in detail, the present disclosure is not limited there, and it will be apparent to those skilled in the art that various modifications and changes can be made thereto within the technical spirit and the scope of the present invention.

What is claimed is:

1. A method, comprising:
   forming a plurality of first active pillars and a plurality of edge pillars in a first semiconductor layer including an active region and a termination region;
   forming a second semiconductor layer on the first semiconductor layer; and
   forming a plurality of second active pillars and a plurality of preliminary charge balance layers in the second semiconductor layer,
   the plurality of first active pillars and the plurality of second active pillars having impurities diffused such that the plurality of first active pillars and the plurality of second active pillars are connected.

2. The method of claim 1, wherein each of the plurality of preliminary charge balance layers have a width greater than or less than a width of a trench of the plurality of second active pillars.

3. The method of claim 1, wherein the plurality of preliminary charge balance layers have widths that decrease with distance from the plurality of second active pillars.

4. The method of claim 1, further comprising:
   forming a third second semiconductor layer on the second semiconductor layer, the third semiconductor layer having a thickness less than a thickness of the second semiconductor layer.

5. The method of claim 1, wherein the plurality of edge pillars are formed via a plurality of edge openings regularly arranged in a matrix form.

6. The method of claim 5, wherein the plurality of edge openings have a circular shape.

7. The method of claim 1, wherein at least one of the plurality of edge pillars is formed via an edge opening and at least one of the plurality of first active pillars is formed via an active trench opening, the active trench opening has an area the same as an area of the edge opening.

8. The method of claim 1, wherein the first semiconductor layer is an epitaxial layer that has a thickness the same as the thickness of the second semiconductor layer.

9. The method of claim 1, wherein the edge pillars are disposed in the termination region and the first active pillars are disposed in the active region.

10. The method of claim 1, further comprising:
annealing the first and second semiconductor layers,
during the annealing, impurities implanted into the plurality of preliminary charge balance layers being diffused, and adjacent layers of the plurality of preliminary charge balance layers being connected to form a lower charge balance region having a tapered shape or a non-tapered shape.

11. The method of claim 1, wherein the forming the plurality of first active pillars and the plurality of edge pillars includes respectively implanting impurities in the active region and the termination region of the first semiconductor layer to form the plurality of first active pillars and the plurality of edge pillars.

12. The method of claim 1, further comprising:
annealing the first and second semiconductor layers such that the plurality of first active pillars and the plurality of second active pillars are connected,
during the annealing, impurities implanted into the plurality of edge pillars and the plurality of preliminary charge balance layers being diffused, and the plurality of edge pillars and the plurality of preliminary charge balance layers being connected.

13. A method, comprising:
forming a plurality of first active pillars and a plurality of edge pillars in a first semiconductor layer including an active region and a termination region;
forming a second semiconductor layer on the first semiconductor layer; and
forming a plurality of second active pillars and a plurality of preliminary charge balance layers in the second semiconductor layer,
the plurality of preliminary charge balance layers being diffused, and adjacent ones of the plurality of preliminary charge balance layers being connected, thereby forming a lower charge balance region.

14. The method of claim 13, further comprising:
annealing the first and second semiconductor layers,
during the annealing, the plurality of first active pillars and the plurality of second active pillars being connected by diffusing impurities implanted into the plurality of first active pillars and the plurality of second active pillars.

15. The method of claim 13, wherein the forming the plurality of second active pillars and the plurality of preliminary charge balance layers includes respectively implanting impurities into the active region and the termination region of the second semiconductor layer, using a second ion implantation mask, thereby forming the plurality of second active pillars and the plurality of preliminary charge balance layers, and
the second ion implantation mask includes a plurality of stripe-shaped first trenches extending in a first direction and a plurality of openings spaced apart from each other in the first direction and a second direction perpendicular to the first direction.

16. The method of claim 13, wherein the forming the plurality of first active pillars and the plurality of edge pillars includes respectively implanting impurities in the active region and the termination region of the first semiconductor layer, using a first ion implantation mask, thereby forming the plurality of first active pillars and the plurality of edge pillars, and
the first ion implantation mask includes a plurality of stripe-shaped second trenches extending in a first direction and a plurality of stripe-shaped third trenches extending in the first direction.

17. The method of claim 13, wherein the plurality of edge pillars and the plurality of preliminary charge balance layers are connected during an annealing process.

18. The method of claim 13, further comprising:
annealing the first and second semiconductor layers,
in the annealing, impurities implanted into the plurality of preliminary charge balance layers being diffused, and adjacent ones of the plurality of preliminary charge balance layers being connected, thereby forming a lower charge balance region.

19. The method of claim 13, wherein each of the plurality of preliminary charge balance layers have a width greater than or less than a width of a trench of the plurality of second active pillars.

20. The method of claim 13, wherein the plurality of preliminary charge balance layers have widths that decrease with distance from the plurality of second active pillars.

21. A method, comprising:
forming a termination region around an active region,
forming, in the active region, a drift layer disposed on a semiconductor layer having a first conductivity type;
forming, in the termination region, an upper edge region including:
a lower charge balance region disposed on one side of the drift layer, the lower charge balance region having second conductivity type, the lower charge balance region having a tapered shape or a non-tapered shape, and
an upper charge balance region disposed on the lower charge balance region, the upper charge balance region having the first conductivity.

22. The method of claim 21, further comprising:
forming a transition region disposed between the active region and the termination region.

* * * * *